(12) United States Patent
Belady

(10) Patent No.: US 7,810,341 B2
(45) Date of Patent: *Oct. 12, 2010

(54) REDUNDANT UPGRADEABLE, MODULAR DATA CENTER COOLING APPARATUS

(75) Inventor: Christian L. Belady, McKinney, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 1328 days.

This patent is subject to a terminal disclaimer.

(21) Appl. No.: 11/273,274

(22) Filed: Nov. 14, 2005

(65) Prior Publication Data

US 2006/0065000 A1   Mar. 30, 2006

Related U.S. Application Data

(63) Continuation-in-part of application No. 10/830,503, filed on Apr. 22, 2004.

(51) Int. Cl.
  *F25D 23/12* (2006.01)
(52) U.S. Cl. .................................. 62/259.2
(58) Field of Classification Search ............... 62/259.2, 62/407; 361/691, 702, 688
  See application file for complete search history.

(56) References Cited

U.S. PATENT DOCUMENTS

| 5,345,779 | A  | * | 9/1994  | Feeney ................... 62/259.2 |
| 2001/0052235 | A1 | * | 12/2001 | Durham .................... 62/175 |
| 2004/0221604 | A1 | * | 11/2004 | Ota et al. ................. 62/259.2 |
| 2005/0235671 | A1 | * | 10/2005 | Belady et al. ............. 62/259.2 |

* cited by examiner

*Primary Examiner*—Melvin Jones

(57) ABSTRACT

A data center is configured in a room using alternating rows of racks containing heat-generating electronic devices and air conditioners or liquid conditioners. Chilled fluid, such as water or a refrigerant, for the air conditioners or liquid conditioners is supplied through redundant plumbing comprising first and second supply and return pipes below a raised floor. Attached to this redundant plumbing are standard fluid couplings configured to couple to either air conditioners or liquid conditioners. The air conditioners and liquid conditioners use the same chilled fluid so that they may share the redundant plumbing and continually receive chilled fluid in the event of the failure of one of the chilled fluid supplies.

23 Claims, 16 Drawing Sheets

REDUNDANT UPGRADEABLE, MODULAR DATA CENTER COOLING APPARATUS

CROSS-REFERENCE TO A RELATED APPLICATION

The present application is a continuation-in-part of Ser. No. 10/830,503, filed Apr. 22, 2004, and entitled "Upgradeable, Modular Data Center Cooling Apparatus."

BACKGROUND

The present invention relates generally to the field of computer data centers, and more particularly to the field of cooling computer data centers.

Densification in data centers is becoming so extreme that the power density of the systems in the center is growing at a rate unmatched by technology developments in data center heating, ventilation, and air-conditioning (HVAC) designs. Current servers and disk storage systems generate 10,000 to 20,000 watts per square meter of footprint. Telecommunication equipment may generate two to three times the heat of the servers and disk storage systems. Liquid-cooled computers could solve this heat transfer problem; however, there is reluctance by both end users and computer manufacturers to make the transition from air-cooled computers to liquid-cooled computers. Also, there currently is no easy way to transition from an air-cooled data center to a liquid-cooled data center without a major overhaul of the data center and substantial down time to retrofit the data center.

Computer designers are continuing to invent methods that extend the air-cooling limits of individual racks of computers (or other electronic heat-generating devices) that are air-cooled. However, these high heat capacity racks require extraordinary amounts of air to remove the heat dissipated by the racks, requiring expensive and large air handling equipment.

Many data centers utilize a system utilizing a raised floor configured as a supply air plenum. Large HVAC units take air from near the ceiling of the data center, chill the air, and blow the cold air into the plenum under the raised floor. Vents in the floor near the servers allow cold air to be pulled up from the plenum, through the rack and the now warm air is blown out the back of the rack where it rises to the ceiling and eventually is pulled in to the HVAC units to begin the cycle anew. However, this type of system is limited in that it can only handle power of about 1600 to 2100 watts per square meter, significantly under the heat generated by many current electronic systems. Thus, the data center must contain significant amounts of empty space in order to be capable of cooling the equipment. Also, use of the under floor plenum has difficulties in that airflow is often impeded by cabling and other obstructions residing in the plenum. Further, perforated tiles limit airflow from the plenum into the data center to approximately 6 cubic meters per minute, well below the 60 cubic meters per minute required by some server racks. Even the use of blowers to actively pull cold air from the plenum and direct it to the front of the rack is insufficient to cool many data centers. Balancing the airflow throughout the data center is difficult, and often requires a substantial amount of trial and error experimentation. Finally, the airflow is somewhat inefficient in that there is a substantial amount of mixing of hot and cold air in the spaces above the servers and in the aisles, resulting in a loss of efficiency and capacity.

In an attempt to increase the efficiency of raised floor plenum designs, some designers incorporate a large number of sensors through out the data center in an attempt to maximize the efficiency of the data center cooling with either static or dynamic provisioning cooling based on environmental parameters using active dampers and other environmental controls. Others may use a high pressure cooling system in an attempt to increase the cooling capacity of the raised floor plenum design. However this technique still has all of the inefficiencies of any raised floor plenum design and only increases the power handling capacity of the data center to about 3200 watts per square meter, still below the requirements of densely packed servers or telecommunication devices.

In a desperate attempt to increase cooling capabilities of a data center, some designers use an entire second floor to house their computer room air-conditioners (CRACs). While this allows the use of large numbers of CRACs without use of expensive data center floor space, it effectively acts as a large under floor plenum and is subject to the same inefficiencies and limitations of the under floor plenum design.

Other designers include air coolers within the server racks. For example, a liquid to air heat exchanger may be included on the back of a server rack to cool the air exiting the rack to normal room temperature. However, the airflow of the heat exchanger fans, if they exist, must match the airflow of the server precisely to avoid reliability and operational issues within the server. Also by mounting the heat exchanger on the racks, serviceability of the racks is reduced and the fluid lines attached to the rack must be disconnected before the rack may be moved. This results in less flexibility due to the presence of the liquid line and may require plumbing changes to the area where the rack is being moved to. Also, this technique does not directly cool the heat generating integrated circuits, it is simply a heat exchanger which is not as efficient as direct liquid cooling of the integrated circuits.

Another possibility is the use of overhead cooling which may offer cooling densities in the order of 8600 watts per square meter. However such overhead devices require a high ceiling that also must be strong enough to support the coolers. Also, in such a design, there is no easy migration route from air-cooled to liquid-cooled servers, and some users are concerned about the possibility of leaks from the overhead coolers dripping onto, and possibly damaging, their servers.

SUMMARY

A data center is configured in a room using alternating rows of racks containing heat-generating electronic devices and air conditioners or liquid conditioners. Chilled fluid, such as water or a refrigerant, for the air conditioners or liquid conditioners is supplied through redundant plumbing comprising first and second supply and return pipes below a raised floor. Attached to this redundant plumbing are standard fluid couplings configured to couple to either air conditioners or liquid conditioners. The air conditioners and liquid conditioners use the same chilled fluid so that they may share the redundant plumbing and continually receive chilled fluid in the event of the failure of one of the chilled fluid supplies.

BRIEF DESCRIPTION OF THE DRAWINGS

For a detailed description of exemplary embodiments of the invention, reference will now be made to the accompanying drawings in which.

DETAILED DESCRIPTION

Figure 1:
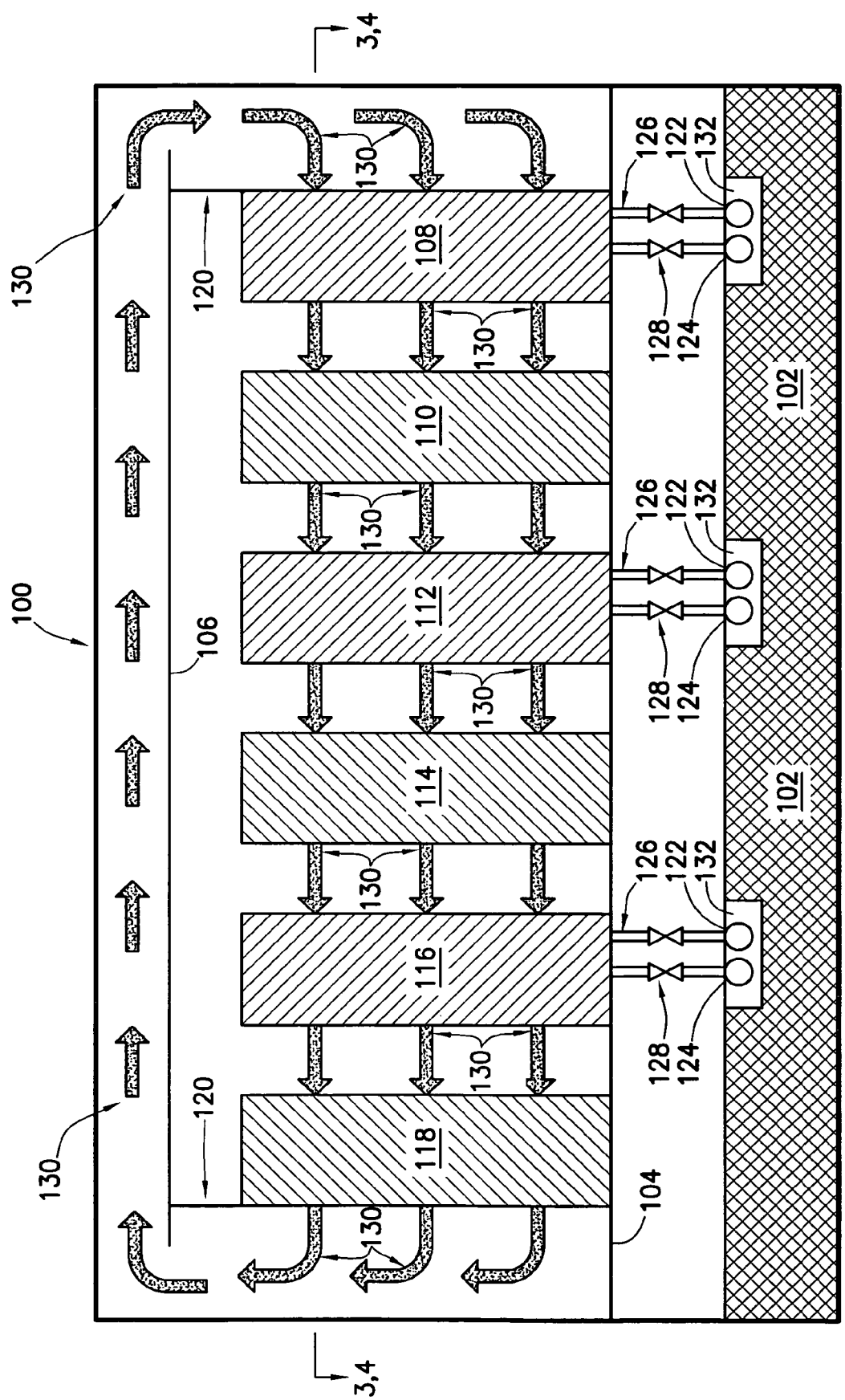
FIG. 1 is a side view of a data center including alternating air-cooled racks and air conditioners according to the present invention.

FIG. 1 is a side view of a data center including alternating air-cooled racks and air conditioners according to the present invention. In this example embodiment of the present invention, a data center comprising a room 100 is built including a raised floor 104 and a foundation 102. Optionally, the room may include a false ceiling 106 for separation of the return airflow. Within the room 100 are a first air conditioning unit 108, a first rack 110, a second air conditioning unit 112, a second rack 114, a third air conditioning unit 116, and a third rack 118. Note that in a typical data center each of these servers and air conditioning units are actually a single unit within a column of units. For example, the first rack 110 represented in this illustration may be a single server within a column of racks or a plurality of servers within a single rack or column of racks. See FIG. 3 for a top view of such a data center including three columns of racks and three columns of air conditioning units, one row of which is shown in FIG. 1. Airflow within the room 100 is shown by gray arrows labeled 130. Notice that the false ceiling 106 separates the warm airflow exiting the third rack 118 as it circulates back to the input of the first air conditioner 108 for increased efficiency. Optionally, small walls 120 maybe used to direct the airflow up over the false ceiling, instead of allowing it to circulate back to the air input of the third rack 118. Likewise a small wall 120 is used to prevent the warm air returning from above the false ceiling 106 from bypassing the first air conditioner 108 and flowing directly into the air input of the first rack 110 without being properly cooled.

Underneath the raised floor 104 may be found the plumbing required by the air conditioning units. In this example embodiment of the present invention, a building chilled fluid supply is provided through chilled fluid supply pipes 122, and returned to the main chiller through chilled fluid return pipes 124 contained within trenches 132 in the foundation 102. This trench is optional, but provides a place for fluids to drain in the event of any leakage, and also by placing the chilled fluid supply pipes 122 and chilled fluid return pipes 124 in the trench, there is more room for cabling with less congestion. Each air conditioning unit is connected to these chilled fluid pipes through air conditioner pipes 126 which each include a fluid coupling 128. Note that the configuration of these pipes and couplings may vary widely according to the needs of each individual data center. In many cases water will be used as the chilled fluid, however other fluids, such as a liquid refrigerant (which may undergo a phase change during the coolant cycle), may be used in its place within the scope of the present invention.

Also note that while three rack and air conditioner pairs are shown in this figure, any number of rack and air conditioner pairs may be used in a similar configuration within the scope of the present invention. Also, as mentioned above, each of the racks and air conditioners shown in FIG. 1 may actually be a single server or rack of servers or air conditioner in a column of racks or air conditioners. In the context of this patent, the term "rack" is used as a generic term for any heat-generating electronic device configured in one or more racks. As noted in the background of the invention, telecommunications switching networks require large cooling capacity and may be configured in a manner similar to that shown in FIG. 1 within the scope of the present invention. The term "rack" is understood to include such switching networks, data storage arrays, servers, or any other heat generating electronic devices within the scope of the present invention. Also, those of skill in the art will recognize that the optional raised floor may be used for cabling, providing humidity or any other functions in addition to containing plumbing connections.

Those of skill in the art will recognize that there are a very wide variety of ways to configure data centers to take advantage of the present invention. There are many different ways to configure air-cooled racks with air conditioners such that the air-cooled racks may be replaced with liquid-cooled racks and the air conditioners may be replaced with liquid conditioning units without disrupting the airflow of any remaining air-cooled racks and air conditioners within the scope of the present invention. The Figures shown in this disclosure are simply a variety of example embodiments of the present invention, not a complete set of the various ways of implementing the present invention. For example, two story data centers may be build such that the air flows left to right on the first floor then is ducted up to the second floor where if flows right to left before being ducted back down to the first floor, completing the cycle.

Figure 2:
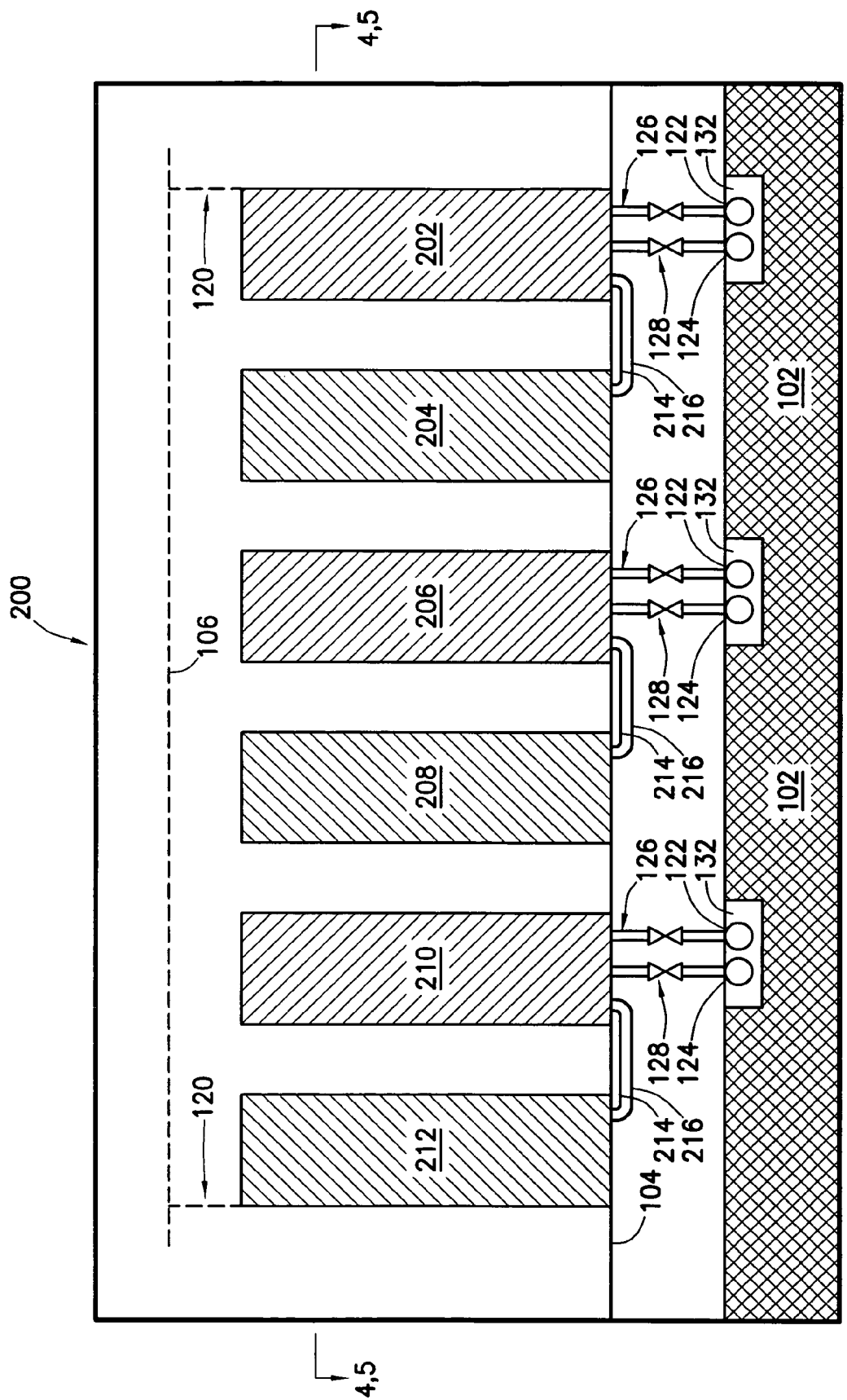
FIG. 2 is a side view of a data center including alternating liquid-cooled racks and liquid cooling units according to the present invention.

FIG. 2 is a side view of a data center including alternating liquid-cooled racks and liquid cooling units according to the present invention. In this example embodiment of the present invention, a data center comprising a room 200 is built including a raised floor 104 and a foundation 102. Optionally the room may include a false ceiling 106 and small walls 120 as shown in FIG. 1 even though they are not required for the liquid-cooled rack configuration shown in the present illustration. Within the room 200 are a first liquid conditioning unit 202, a first rack 204, a second liquid conditioning unit 206, a second rack 208, a third liquid conditioning unit 210, and a third rack 212. Note that in a typical data center each of these racks and liquid conditioning units are actually a single unit within a column of units. For example, the first rack 204 represented in this illustration may be a single server within a column of racks. See FIG. 5 for a top view of such a data center including three columns of racks and three columns of liquid conditioning units, one row of which is shown in FIG. 2. The liquid conditioning units are connected with the racks through a pair of liquid supply pipes including a chilled liquid pipe 214 and a warm liquid pipe 216 used to return the now heated liquid from the servers to the liquid conditioning units.

Underneath the raised floor 104 may be found the plumbing required by the liquid conditioning units. In this example embodiment of the present invention, a building chilled fluid supply is provided through chilled fluid supply pipes 122, and returned to the main chiller through chilled fluid return pipes 124 contained within trenches 132 in the foundation 102. Each liquid conditioning unit is connected to these chilled fluid pipes through liquid conditioner pipes 126 which each include a fluid coupling 128. Note that the configuration of these pipes and couplings may vary widely according to the needs of each individual data center. For example, some data centers may be configured with the fluid supply pipes overhead instead of under a raised floor, However, the fluid couplings 128 must be configured to couple to both air conditioners and liquid conditioning units so that an air conditioner may be replaced by a liquid conditioning unit simply by disconnecting the fluid couplings 128 from the air conditioner and connecting the same fluid couplings 128 to the liquid conditioning unit. In many cases water will he used as the chilled fluid, however other fluids, such as a liquid refrigerant (which may undergo a phase change during the coolant cycle), may be used in its place within the scope of the present invention.

Also note that while three rack and liquid conditioner pairs are shown in this figure, any number of rack and liquid conditioner pairs maybe used in a similar configuration within the scope of the present invention. Also, as mentioned above, each of the racks and liquid conditioners shown in FIG. 2 may actually be a single rack or liquid conditioner in a column of servers or air conditioners In the context of this patent, the term "rack" is used as a generic term for any heat-generating electronic device configured in one or more racks. As noted in the background of the invention, telecommunications switching networks require large cooling capacity and may be configured in a manner similar to that shown in FIG. 2 within the scope of the present invention. The term "rack" is understood to include such switching networks, data storage arrays, servers, or any other heat generating electronic devices within the scope of the present invention.

Figure 3:
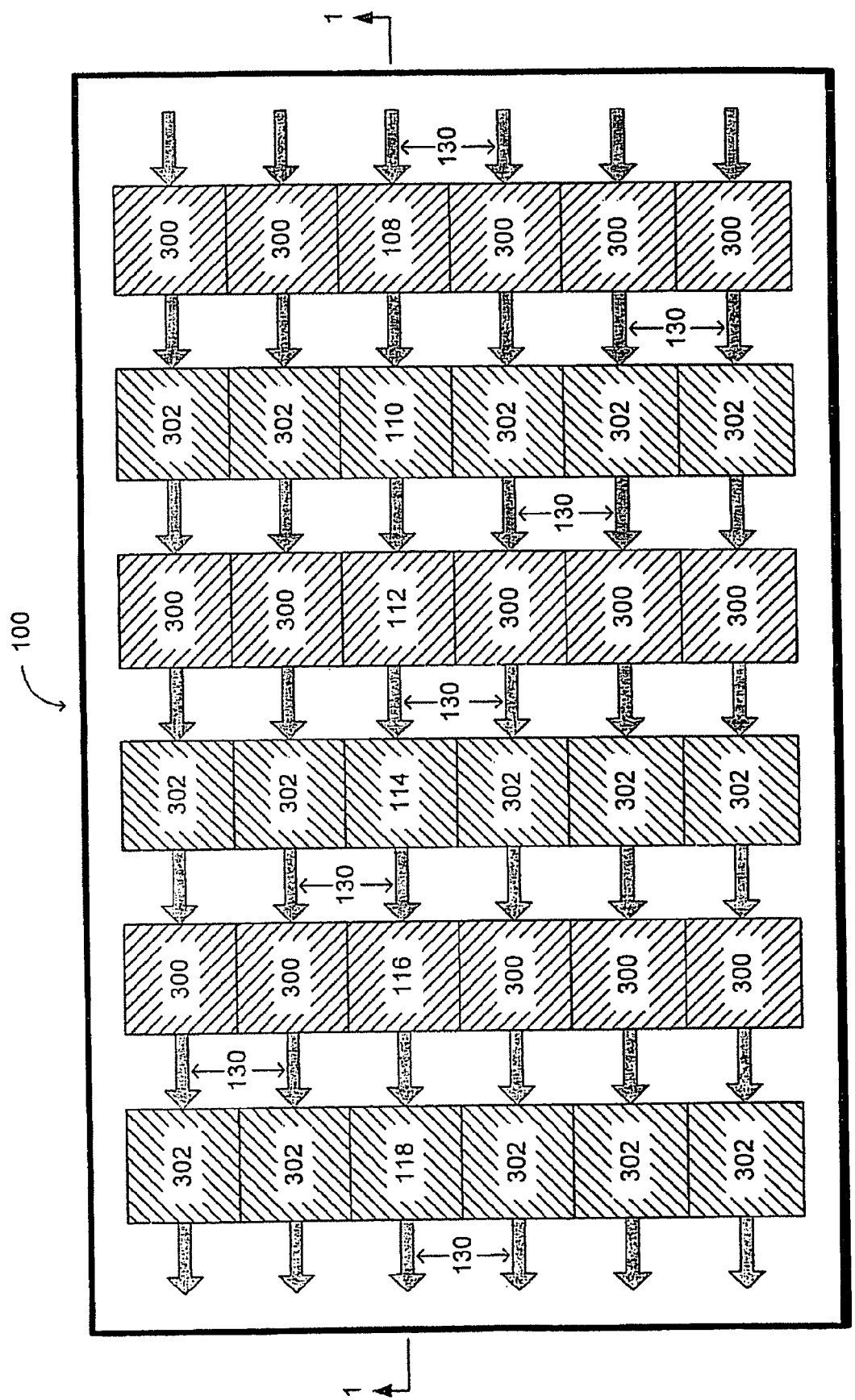
FIG. 3 is a top view of a data center including alternating air-cooled racks and air conditioners according to the present invention.

FIG. 3 is a top view of a data center including alternating air-cooled racks and air conditioners according to the present invention. In this example embodiment of the present invention, a data center containing racks 302 and air conditioning units 300 is built within a room 100. Note that while this example embodiment uses a 1:1 ratio of racks to air conditioning units, depending on the capacity of the air conditioning units and the thermal needs of the racks, other ratios of racks to air conditioning units may be used within the scope of the present invention. As in FIG. 1, airflow is represented by gray arrows labeled 130. Notice that the three pairs of racks and air conditioners shown in FIG. 1 are now seen to be individual racks and air conditioners each within a column of six racks 302 or six air conditioners 300. Air enters the first air conditioner 108 on the right hand side of this figure. Once the now-chilled air leaves the first air conditioner 108 it enters the air intake of the first rack 110. When the heated air leaves the first server 110 it flows into the air intake of the second air conditioner 112. Once the now-chilled air leaves the second air conditioner 112 it enters the air intake of the second rack 114. When the heated air leaves the second rack 114 it flows into the air intake of the third air conditioner 116. Once the now-chilled air leaves the third air conditioner 116 it enters the air intake of the third rack 118. Upon exiting the third rack 118 the now-heated air is re-circulated to the air intakes of the first air conditioner 108.

Figure 4:
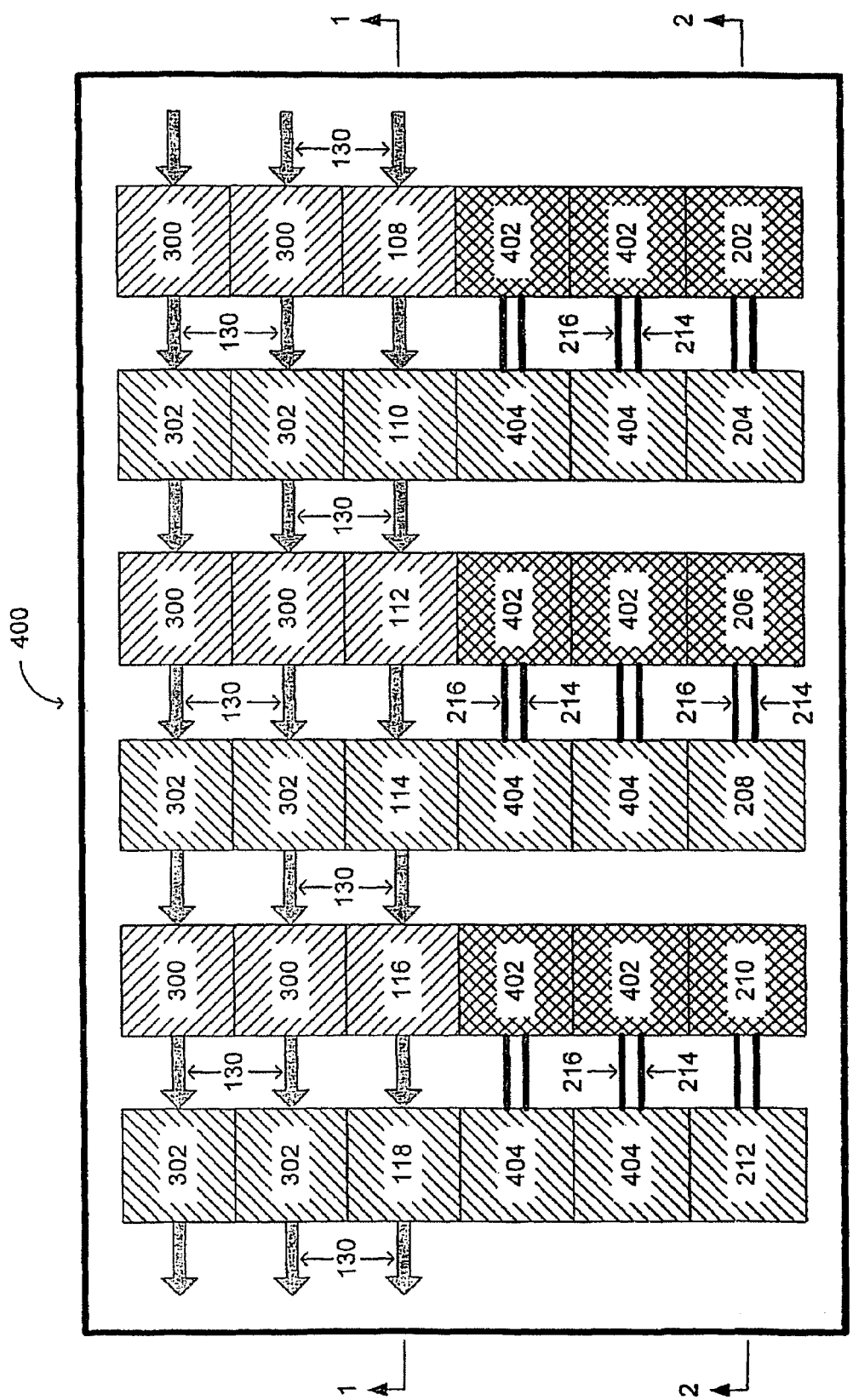
FIG. 4 is a top view of a data center, a fraction of which includes alternating air-cooled racks and air conditioners, while another fraction includes alternating liquid-cooled racks and liquid conditioning units according to the present invention.

FIG. 4 is a top view of a data center, a fraction of which includes alternating air-cooled racks and air conditioners, while another fraction includes alternating liquid-cooled racks and liquid conditioning units according to the present invention. This example embodiment of the present invention illustrates the ease with which the air-cooled racks may be replaced with liquid-cooled racks without disruption of the airflow required by the air-cooled racks and without changes in the infrastructure of the data center. In this example embodiment of the present invention, each column of racks comprises three liquid-cooled racks and three air-cooled servers. Likewise, each column of conditioners comprises three liquid conditioning units and three air conditioning units. While this example embodiment shows the liquid-cooled and air-cooled racks in a 1:1 ratio, those of skill in the art will recognize that using the configuration of the present invention, any ratio of liquid-cooled to air-cooled racks may be used without disruption of the airflow required by the air-cooled racks as long as each row of servers and conditioners is either air or liquid cooled, but not a combination of both. Airflow between the air-cooled racks 302 and the air conditioners 300 is once again represented by gray arrows labeled 130. Similarly, the connections between the liquid-cooled racks 404 and the liquid conditioning units 402 are shown as a chilled liquid pipe 214 and a warm liquid pipe 216 used to return the now-heated liquid from the liquid-cooled racks 404 to the liquid conditioning units 402.

Figure 5:
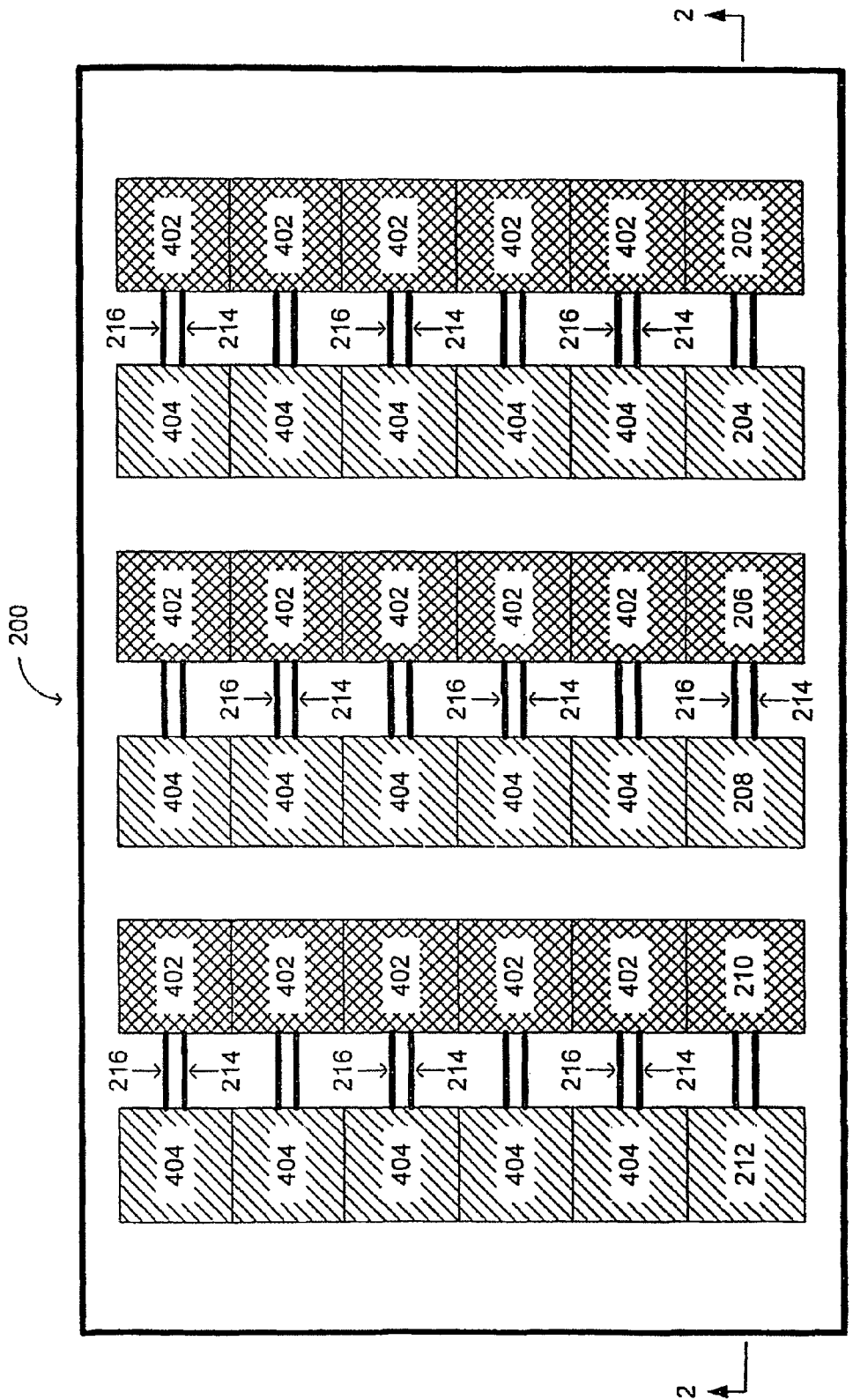
FIG. 5 is a top view of a data center including alternating liquid-cooled racks and liquid conditioning units according to the present invention.

FIG. 5 is a top view of a data center including alternating liquid-cooled racks and liquid conditioning units according to the present invention. Once the entire data center is converted to liquid-cooled racks 404 and liquid conditioning units 402, there is no longer any need for airflow within the data center, so none is shown in this example embodiment of the present invention. This example embodiment is similar to that shown in FIG. 4 with the exception that all of the air-cooled racks and air conditioners have now been replaced with liquid-cooled racks 404 and their corresponding liquid conditioning units 402 in a seamless migration without any infrastructure changes needed.

Figure 6:
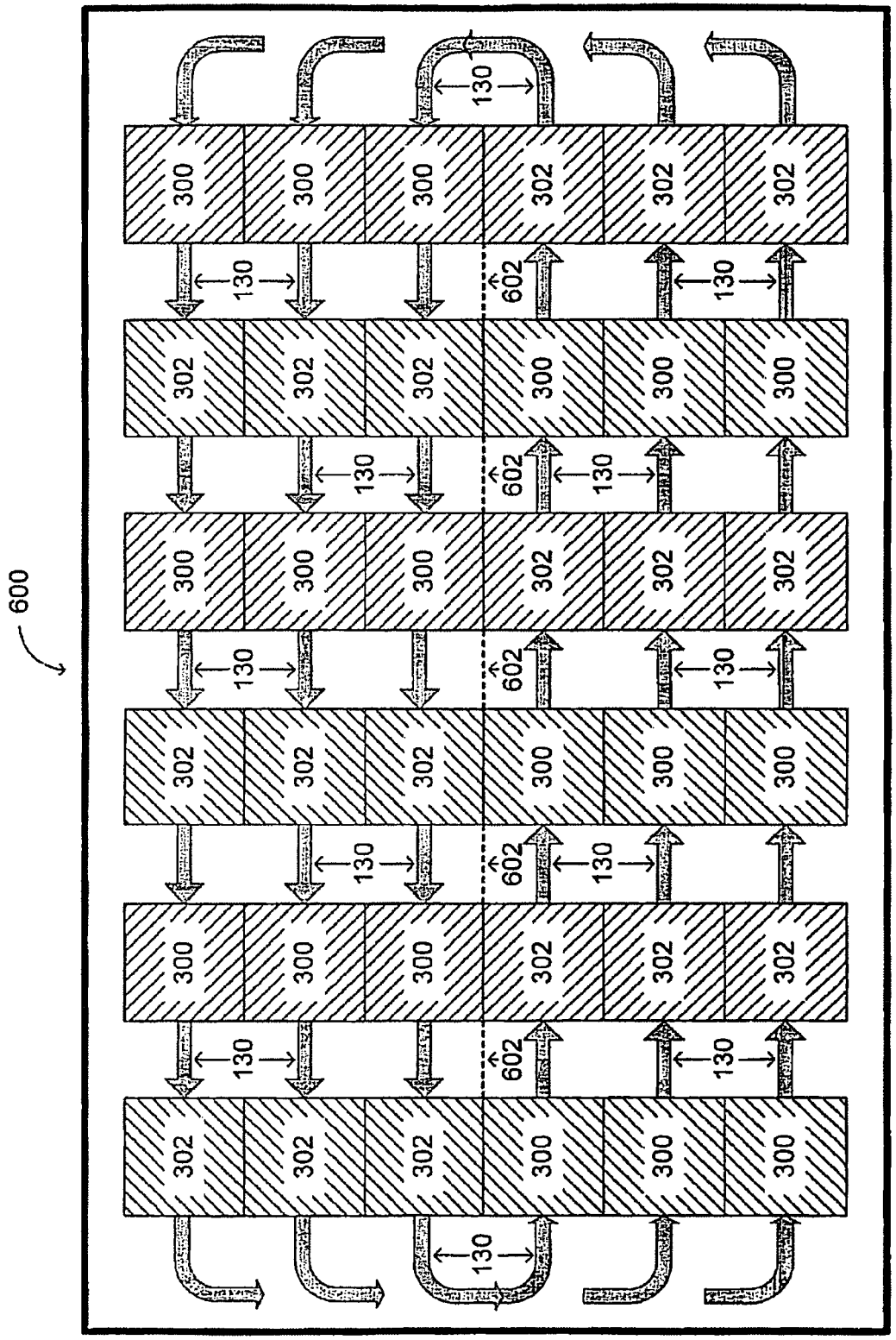
FIG. 6 is a top view of a data center including alternating air-cooled racks and air conditioners according to the present invention.

FIG. 6 is a top view of a data center including alternating air-cooled racks and air conditioners according to the present invention. This example embodiment of the present invention is an alternate configuration to that shown in FIGS. 1 and 3. In this example embodiment, the airflow cycle 130 assumes a circular path around the perimeter of the room 600 instead of forming a vertical circular path along the ceiling of the room 600. Thus there is no longer any need for a false ceiling as shown in FIG. 1. However, to separate the airflows, it may be desirable to include some optional small walls 602 down the center of the data center. However, since at any given point along these optional small walls 602, the air temperature is roughly the same on both sides of the walls, they are not really necessary for cooling efficiency.

Those of skill in the art will recognize that this configuration of the present invention also allows easy transition from air-cooled racks to liquid-cooled racks by replacing a row at a time from the outside of the data center working in to the center of the room, or by replacing a row at a time from the inside of the data center working out to the edges of the room.

Figure 7:
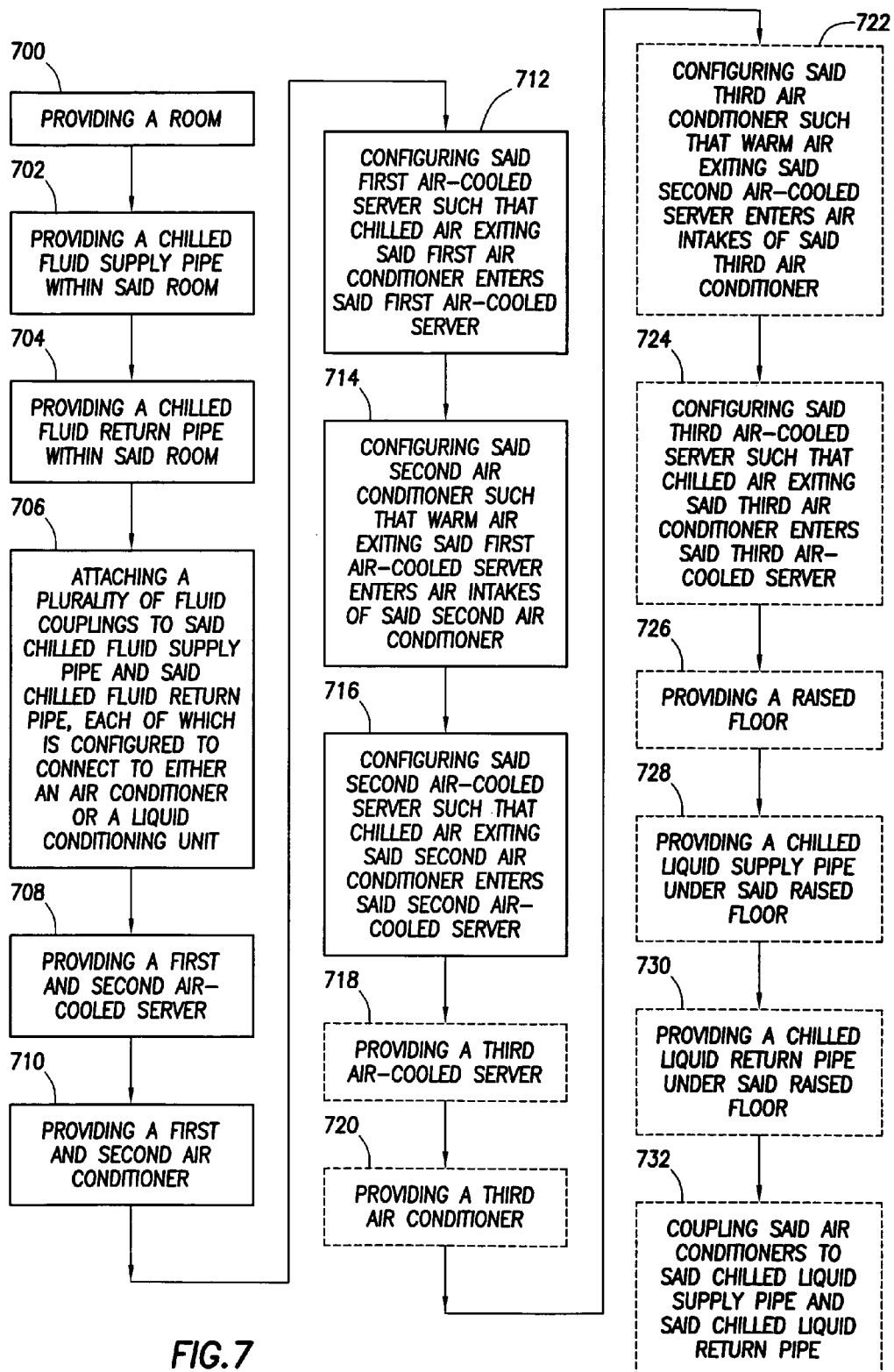
FIG. 7 is a flow chart of a method for configuring a data center with an upgradeable, modular cooling apparatus according to the present invention.

FIG. 7 is a flow chart of a method for configuring a data center with an upgradeable, modular cooling apparatus according to the present invention. In a step 700, a room is provided. In a step 702, a chilled fluid supply pipe is provided within said room. In a step 704, a chilled fluid return pipe is provided within said room. In a step 706 a plurality of fluid couplings are attached to said chilled fluid supply pipe and said chilled fluid return pipe, wherein each of said fluid couplings is configured to connect to either an air conditioner or a liquid conditioning unit. In a step 708, first and second air-cooled servers are provided. In a step 710, first and second air conditioners are provided. In a step 712, the first air-cooled server is configured such that chilled air exiting said first air conditioner enters air intakes of said first air-cooled server. In a step 714, the second air conditioner is configured such that warm air exiting said first air-cooled server enters air intakes of said second air conditioner. In a step 716, the second air-cooled server is configured such that chilled air exiting said second air conditioner enters air intakes of said second air-cooled server. In an optional step 718, a third air-cooled server is provided. In an optional step 720, a third air conditioner is provided. In an optional step 722, the third air conditioner is configured such that warm air exiting said second air-cooled server enters air intakes of said third air conditioner. In an optional step 724, the third air-cooled server is configured such that chilled air exiting said third air conditioner enters air intakes of said third air-cooled server. In an optional step 726, a raised floor is provided. In an optional step 728, a chilled fluid supply pipe is provided under said raised floor. In an optional step 730, a chilled fluid return pipe is provided under said raised floor. In an optional step 732, the air conditioners are coupled to said chilled fluid supply pipe and said chilled fluid return pipe.

Figure 8:
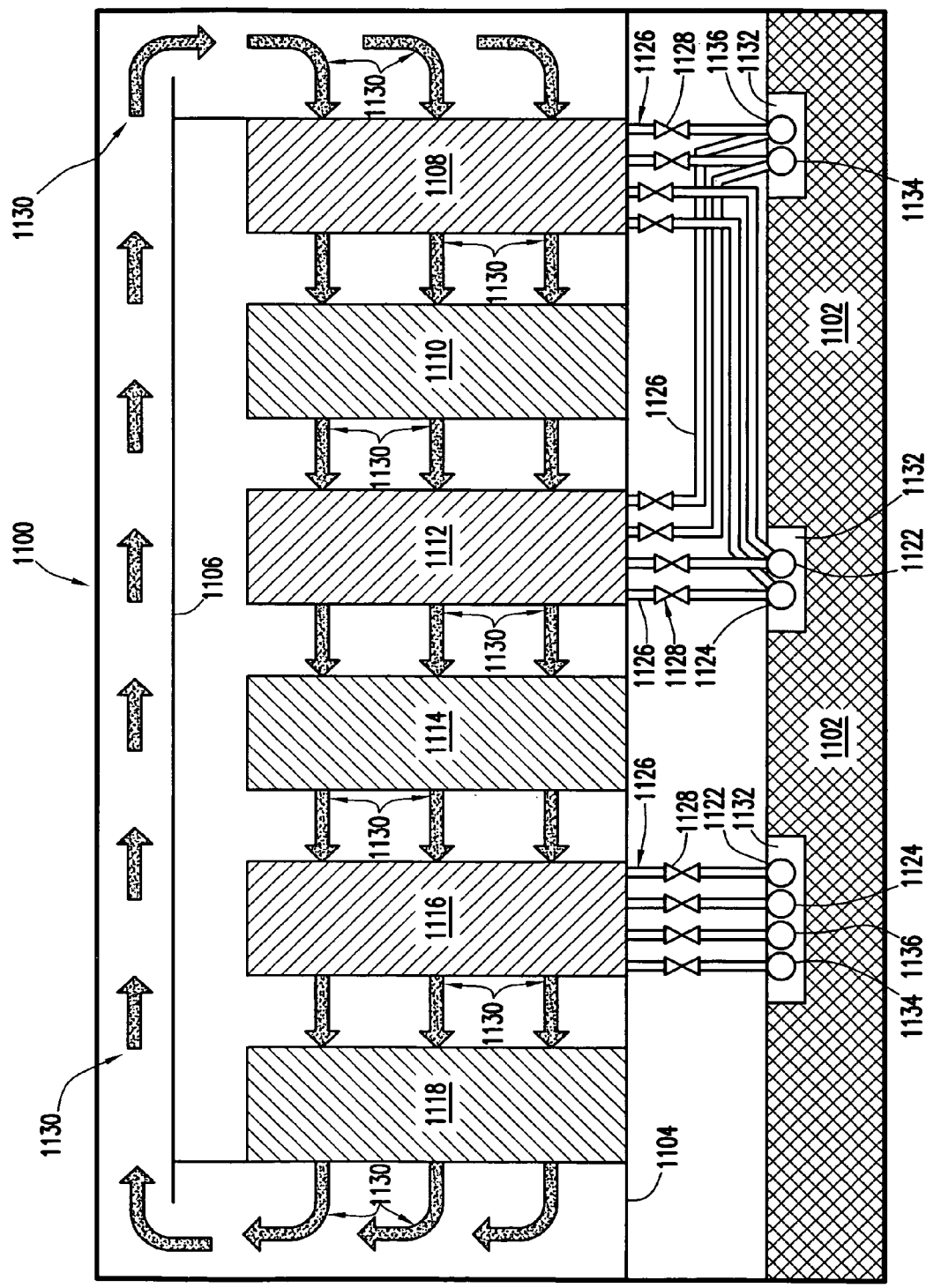
FIG. 8 is a side view of a data center including alternating rows of air-cooled racks and air conditioners according to the present invention.

FIG. 8 is a side view of a data center including alternating rows of air-cooled racks and air conditioners. The data center comprises room 1100, raised floor 1104 and foundation 1102. Optionally, room 1100 may include false ceiling 1106 for separation of the return airflow. Within room 1100 are first air conditioner 1108, first air-cooled rack 1110, second air conditioner 1112, second air-cooled rack 1114, third air conditioner 1116, and third air-cooled rack 1118. Airflow within room 1100 is shown by arrows labeled 1130. False ceiling 1106 separates the warm airflow exiting third air-cooled rack 1118 as it circulates back to the input of first air conditioner 1108 for increased efficiency.

The plumbing for air conditioners 1108, 1112, and 1118 is disposed underneath raised floor 1104. A first building chilled fluid supply is provided within trenches 1132 in foundation 1102 through first chilled fluid supply pipes 1122, and returned to the main chiller (not shown) through first chilled fluid return pipes 1124. Also present is a second building chilled fluid supply provided through second chilled fluid supply pipes 1134 and returned to the main chiller through second chilled fluid return pipes 1136.

Each air conditioner is connected, via fluid couplings 1128 and conditioner pipes 1126, to fluid supply pipe 1122, 1134 and fluid return pipes 1124, 1136. The embodiment shown in FIG. 8 depicts a redundant building chilled fluid supply for each air conditioner. The redundant plumbing created by adding second chilled fluid supply pipe 1134 and second chilled fluid return pipe 136 allows the air conditioners to remain in operation in the event that the first building chilled fluid supply is lost. The configuration of these pipes and couplings may vary widely according to the needs of each individual data center.

Figure 9:
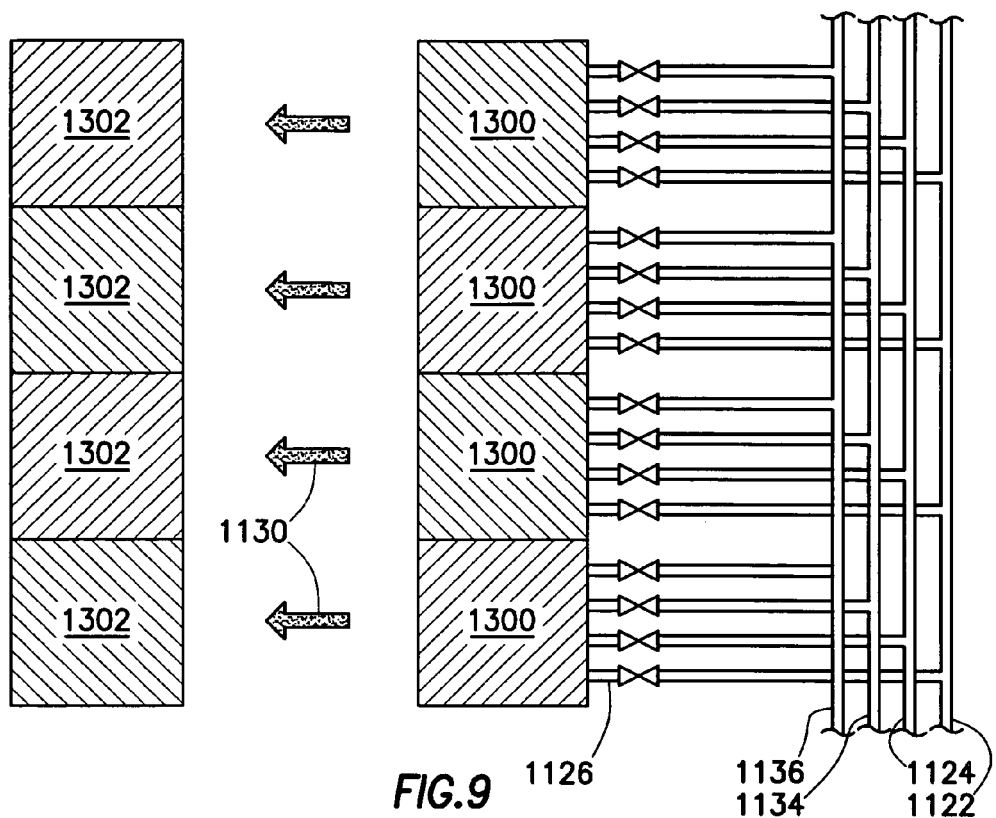
FIG. 9 is a top view schematic representation of a data center including alternating rows of air-cooled racks and air conditioners according to the present invention.

FIG. 9 is a top view schematic representation of a data center featuring alternating rows of air-cooled racks and air conditioners. The data center contains a row of air conditioners 1300 and a corresponding row of air-cooled racks 1302. Each air conditioner 1300 is coupled through conditioner pipes 1126 to first chilled fluid supply pipe 1122, first chilled fluid return pipe 1124, second chilled fluid supply pipe 1134 and second chilled fluid return pipe 1136. Each conditioner pipe 1126 includes a fluid coupling 1128. The redundant plumbing depicted in this embodiment provides for the continual supply of building chilled fluid to air conditioners 1300 in the event that the first chilled fluid supply pipe 1122 or first chilled fluid return pipe 1124 fails.

Figure 10:
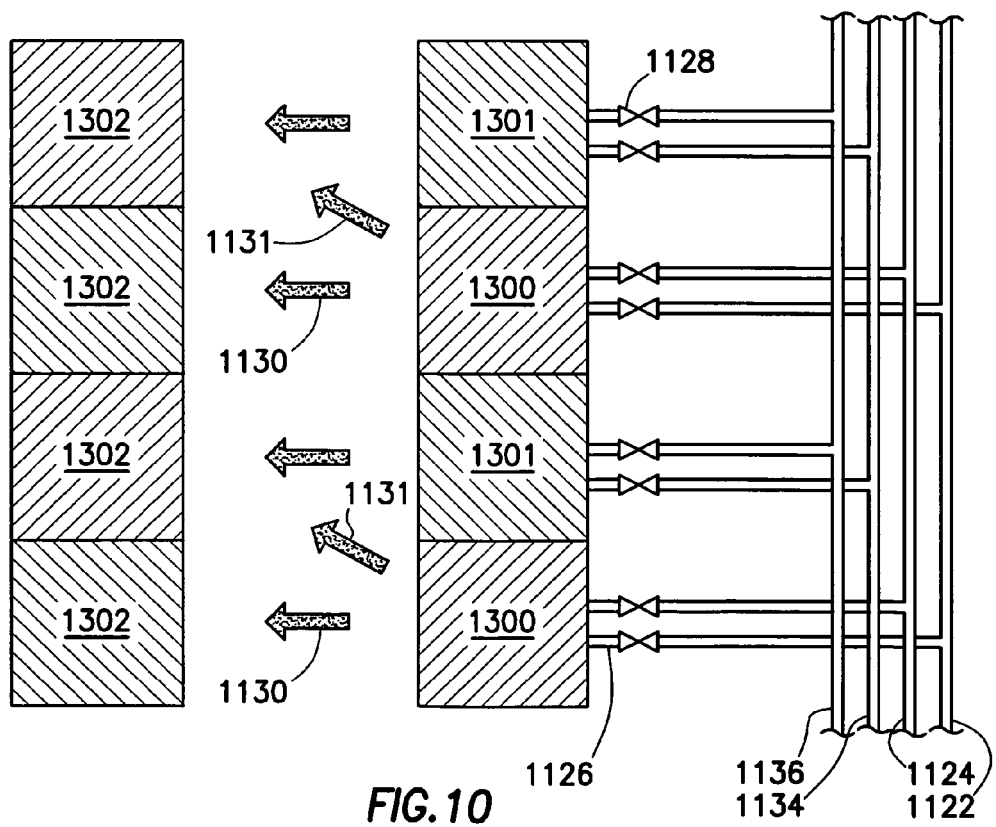
FIG. 10 is a top view schematic representation of a data center including alternating rows of air-cooled racks and air conditioners according to the present invention.

FIG. 10 is a top view schematic representation of a data center featuring alternating rows of air-cooled racks and air conditioners. The data center contains a row of air conditioners 1300 and 1301 and a corresponding row of air-cooler racks 1302. Air conditioner 1300 is coupled through conditioner pipes 1126 to first chilled fluid supply pipe 1122 and first chilled fluid return pipe 1124. Air conditioner 1301 is coupled through conditioner pipes 1126 to second chilled fluid supply pipe 1134 and second chilled fluid return pipe 1136. Each conditioner pipe 1126 includes a fluid coupling 1128. Ideally, air conditioners 1300 and 1301 concurrently deliver conditioned air, represented by the arrows labeled 1130, to air-cooled racks 1302. In the event that either chilled fluid supply pipe 1122, 1134 fails to deliver chilled fluid to air conditioner 1301, or the air conditioner itself fails, the other air conditioner 1300 can continue to provide conditioned air to air-cooled racks 1302, represented by arrows 1131, as a result of the redundancy provided by the incorporation of two chilled fluid supply pipes 1122, 1134.

Figure 11:
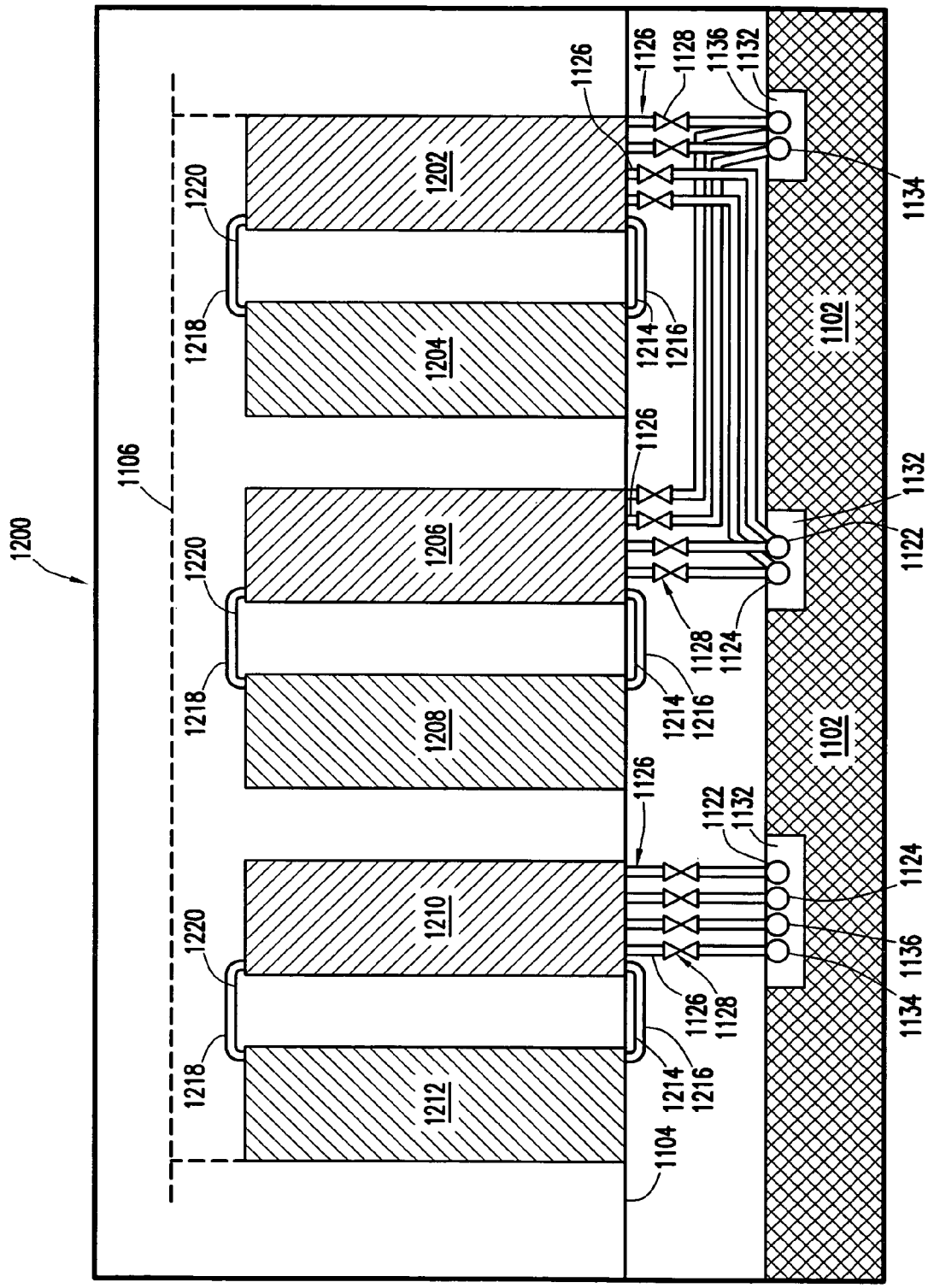
FIG. 11 is a side view of a data center including alternating rows of liquid-cooled racks and liquid conditioners according to the present invention.

FIG. 11 is a side view of a data center including alternating rows of liquid-cooled racks and liquid conditioners. The data center comprises room 1200, raised floor 1104, and foundation 1102. False ceiling 1106 is optional in the configuration of the data center in this embodiment. Within room 1200 are first liquid conditioner 1202, first liquid-cooled rack 1204, second liquid conditioner 1206, second liquid-cooled rack 1208, third liquid conditioner 1210, and third liquid-cooled rack 1212. Each of these racks and liquid conditioners may comprise a single unit within a column of units. For example, the first liquid-cooled rack 1204 represented in this illustration may be a single server within a column of racks.

Liquid conditioners 1202, 1206, and 1210 are connected with liquid-cooled racks 1204, 1208, and 1212 through a pair of liquid supply pipes including first conditioned liquid pipe 1214, and first warm liquid pipe 1216 used to return the now heated liquid from the servers to the liquid conditioners. The liquid conditioners are further connected with the liquid-cooled racks through a second pair of liquid supply pipes including a second conditioned liquid pipe 1218 and a second warm liquid pipe 1220.

The building chilled fluid supply plumbing that is required by the liquid conditioners is located underneath raised floor 1104 within trenches 1132 in foundation 1102. A first building chilled fluid supply is provided through first chilled fluid supply pipes 1122, and returned to the main chiller (not shown) through first chilled fluid return pipes 1124. Also present are a second building chilled fluid supply provided through second chilled fluid supply pipes 1134 and returned to the main chiller through second chilled fluid return pipes 1136.

Each liquid conditioner is connected to first chilled fluid supply pipe 1122 and first chilled fluid return pipe 1124, and to second chilled fluid supply pipe 1134 and second chilled fluid return pipe 1136 through conditioner pipes 1126 and fluid couplings 128. Thus, the embodiment shown in FIG. 11 depicts a redundant building chilled fluid supply for each liquid conditioner. The redundant plumbing creating by adding second chilled fluid supply pipe 1134 and second chilled fluid return pipe 1136 allows the liquid conditioners to remain in operation in the event that the first building chilled fluid supply is lost. Additionally, the redundancy created by adding second conditioned liquid pipe 1218 and second warm liquid pipe 1220 allows the liquid conditioners to continually deliver conditioned liquid to the liquid-cooled racks in the event that first conditioned liquid pipe 1214 or first warm liquid pipe 1216 fails or failures within the conditioners.

The configuration of these pipes and couplings may vary widely according to the needs of each individual data center. For example, while three liquid-cooled rack and liquid conditioner pairs are shown in this figure, any number of liquid-cooled rack and liquid conditioner pairs maybe used in a similar configuration. Also, each of the liquid-cooled racks and liquid conditioners may actually be a single liquid-cooled rack or liquid conditioner in a column of servers or liquid conditioners. Fluid couplings 1128 may be configured to couple to both air conditioners and liquid conditioners so that an air conditioner may be replaced by a liquid conditioner simply by disconnecting the fluid couplings 1128 from the air conditioner and connecting the same fluid couplings 1128 to the liquid conditioner. Thus allowing the data center infrastructure to support both liquid-cooled and air-cooled systems.

Figure 12:
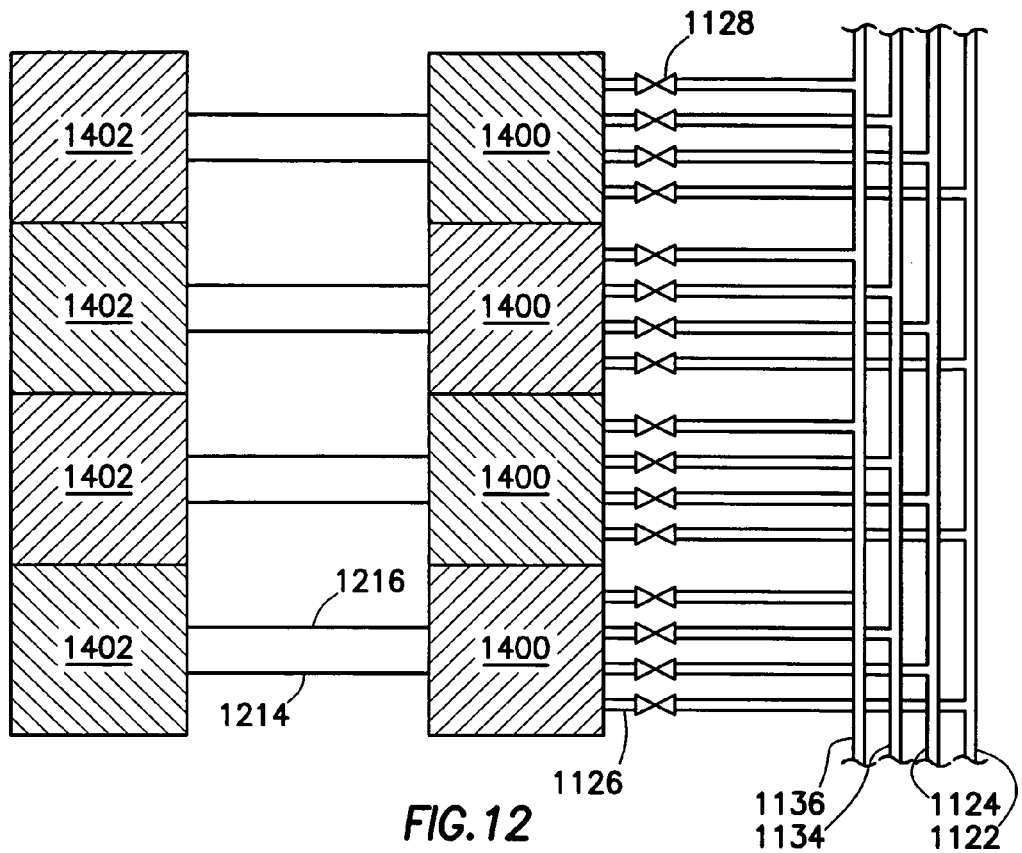
FIG. 12 is a top view schematic representation of a data center including alternating rows of liquid-cooled racks and liquid conditioners according to the present invention.

FIG. 12 is a top view schematic representation of a data center featuring alternating rows of liquid-cooled racks and liquid conditioners. The data center contains a row of liquid conditioners 1400 and a corresponding row of liquid-cooled racks 1402. Each liquid conditioner 1400 is coupled through conditioner pipes 1126 to first chilled fluid supply 1122, first chilled fluid return pipe 1124, second chilled fluid supply pipe 1134, and second chilled fluid return pipe 1136. Each conditioner pipe 1126 includes a fluid coupling 1128. Liquid conditioner 1400 further conditions the chilled fluid and delivers conditioned liquid to the corresponding liquid-cooled rack 1402 through first conditioned liquid pipe 1214. The warm liquid is returned to liquid conditioner 1400 through first warm liquid pipe 1216. The redundant chilled fluid plumbing provides for the continual supply of building chilled fluid to liquid conditioner 1400 in the event that first chilled fluid supply pipe 1122 or first chilled fluid return pipe 1124 fails or the circuits supplying fluid to these pipes fail.

Figure 13:
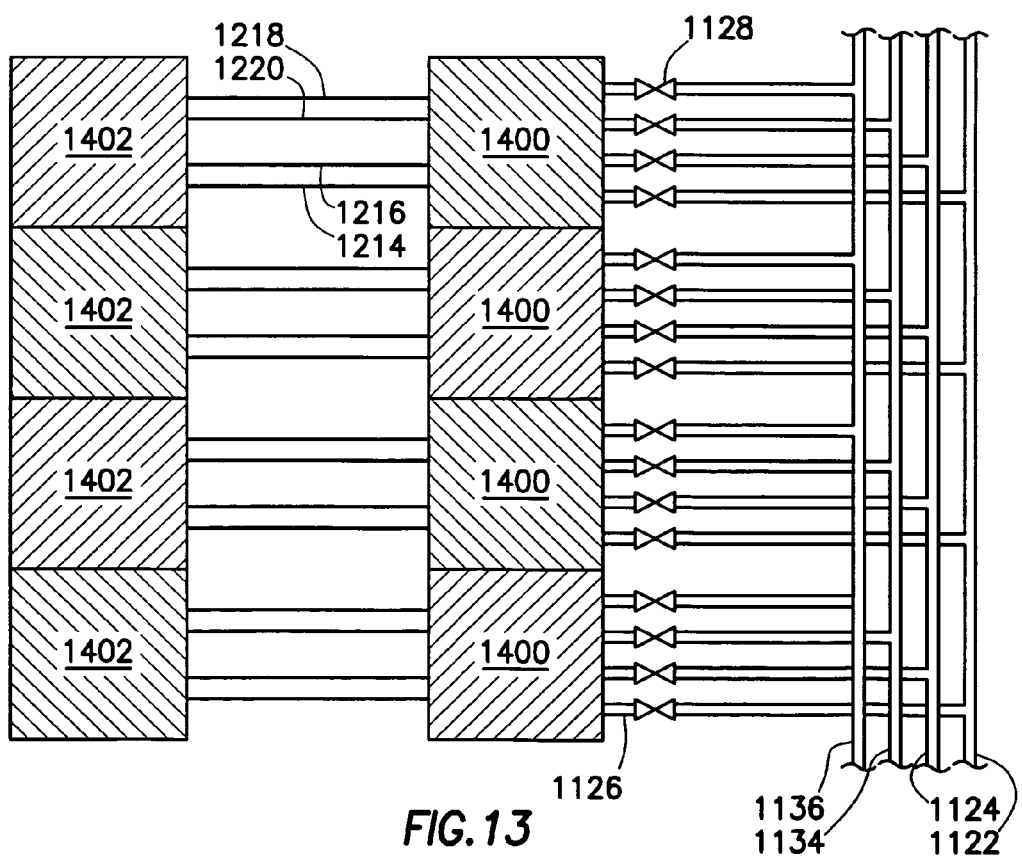
FIG. 13 is a top view schematic representation of a data center including alternating rows of liquid-cooled racks and liquid conditioners according to the present invention.

FIG. 13 is a top view schematic representation of a data center featuring alternating rows of liquid-cooled racks and liquid conditions. In FIG. 13, another level of redundant plumbing is added to the data center of FIG. 12. Liquid conditioner 1400 is further connected to liquid-cooled rack 1402 through second conditioned liquid pipe 1218, and liquid is returned from liquid-cooled rack 1402 to liquid conditioner 1400 through second warm liquid pipe 1220. In this configuration, the liquid conditioner to liquid-cooled rack connection is redundantly plumbed in addition to the redundant connection between liquid conditioner 1400 and the building chilled fluid plumbing. The redundant plumbing between liquid conditioner 1400 and liquid-cooled rack 1402 provides for the continual supply of conditioned liquid to liquid-cooled rack 1402 in the event that first chilled fluid supply pipe 1122, first chilled fluid return pipe 1124, first conditioned liquid pipe 1214 or first warm liquid pipe 1216 fails.

Figure 14:
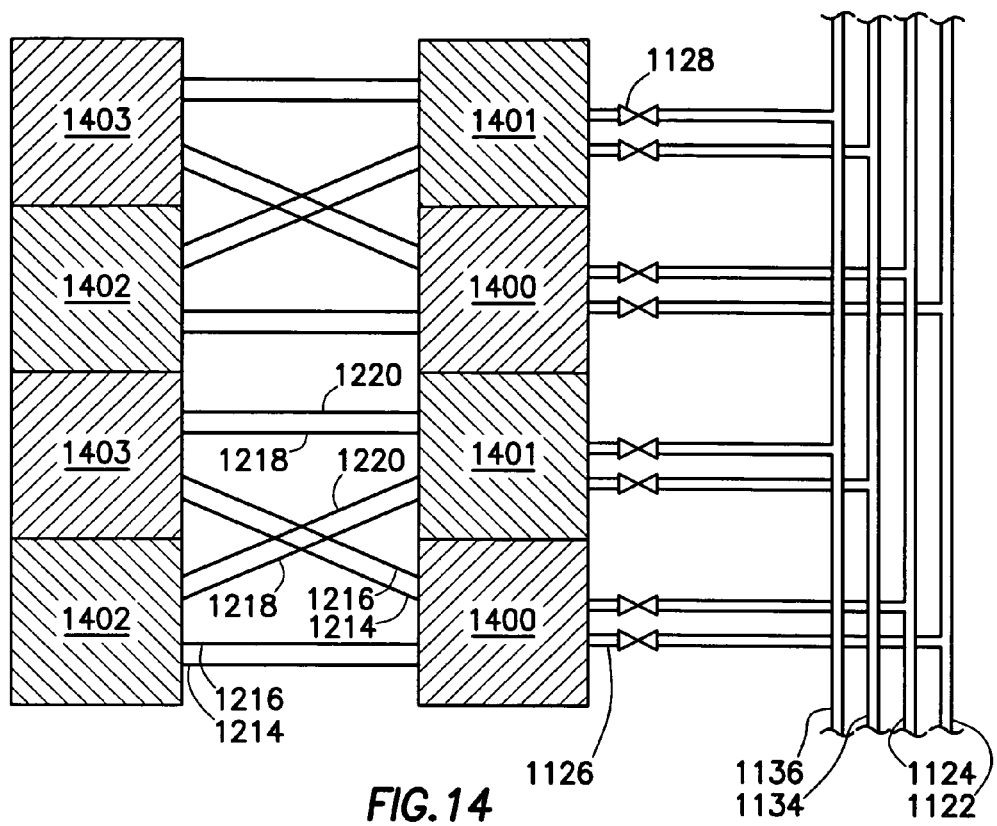
FIG. 14 is a top view schematic representation of a data center including alternating rows of liquid-cooled racks and liquid conditioners according to the present invention.

FIG. 14 is a top view schematic representation of a data center featuring alternating rows of liquid-cooled racks and liquid conditioners. The data center contains a row of liquid conditioners 1400 and 1401 and a corresponding row of liquid-cooled racks 1402 and 1403. Liquid conditioner 1400 is coupled through conditioner pipes 1126 to first chilled fluid supply pipe 1122 and first chilled fluid return pipe 1124. Liquid conditioner 1401 is coupled through conditioner pipes 1126 to second chilled fluid supply 1134 and second chilled fluid return pipe 1136.

Liquid conditioner 1400 is connected to liquid-cooled racks 1402 and 1403 through a pair of first conditioned liquid pipes 1214. Conditioned liquid is circulated through liquid-cooled racks 1402 and 1403 and then returned to liquid conditioner 1400 through a pair of first warm liquid pipes 1216. Additionally, liquid conditioner 1401 is connected to liquid-cooled racks 1402 and 1403 through a pair of second conditioned liquid pipes 1218, and similarly returned to liquid conditioner 1401 through a pair of second warm liquid pipes 1220. In the event that liquid conditioner 1400, first chilled fluid supply pipe 1122, first chilled fluid return pipe 1124, first conditioned liquid pipe 1214 or first warm liquid pipe 1216 fails, conditioned liquid is supplied to liquid-cooled racks 1402 and 1403 through the redundant plumbing. The plumbing is redundant not only from the building chilled fluid supply to the liquid conditioner, but also from the liquid conditioner to the liquid-cooled rack. As such, there are no single points of failure in the plumbing and operations can be continued when individual conditioners or plumbing systems are being serviced.

Figure 15:
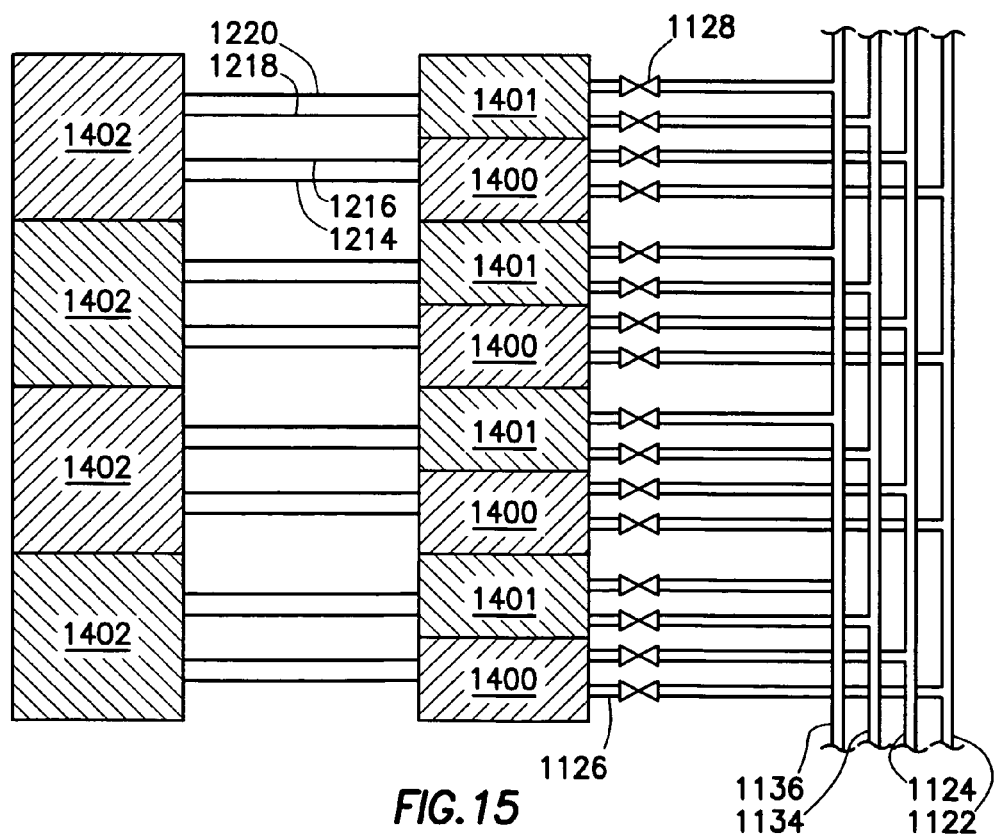
FIG. 15 is a top view schematic representation of a data center including alternating rows of liquid-cooled racks and liquid conditioners according to the present invention.

FIG. 15 is a top view schematic representation of a data center featuring alternating rows of liquid-cooled racks and liquid conditioners. The data center contains a row of liquid conditioners 1400 and 1401 and a corresponding row of liquid-cooled racks 1402. Liquid conditioner 1400 is coupled through conditioner pipes 1126 to first chilled fluid supply pipe 1122 and first chilled fluid return pipe 1124. Liquid conditioner 1401 is coupled through conditioner pipes 1126 to second chilled fluid supply pipe 1134 and second chilled fluid return pipe 1136.

Both liquid conditioner 1400 and liquid conditioner 1401 are configured to supply conditioned liquid to liquid-cooled rack 1402. Liquid conditioner 1400 is connected to liquid-cooled rack 1402 through first conditioned liquid pipe 1214. After the conditioned liquid is circulated through liquid-cooled rack 1402 it is returned to liquid conditioner 1400 through first warm liquid pipe 1216. Liquid conditioner 1401 is connected to liquid-cooled rack 1402 through second conditioned liquid pipe 1218, and conditioned liquid is returned to liquid conditioner 1401 after circulating through liquid-cooled rack 1402 through second warm liquid pipe 1220. The redundant plumbing in the present embodiment provides that in the event liquid conditioner 1400, first chilled fluid supply pipe 1122, first chilled fluid return pipe 1124, first conditioned liquid pipe 1214, or first warm liquid pipe 1216 fails, liquid-cooler rack 1402 will continue to receive conditioned liquid. The continual supply is possible through multiple redundancies created by the incorporation of liquid conditioner 1401, second chilled fluid supply pipe 1134, second chilled fluid return pipe 1136, second conditioned liquid pipe 1218, and second warm liquid pipe 1220. As such, there are no single points of failure in the plumbing or liquid conditioner configuration.

Figure 16:
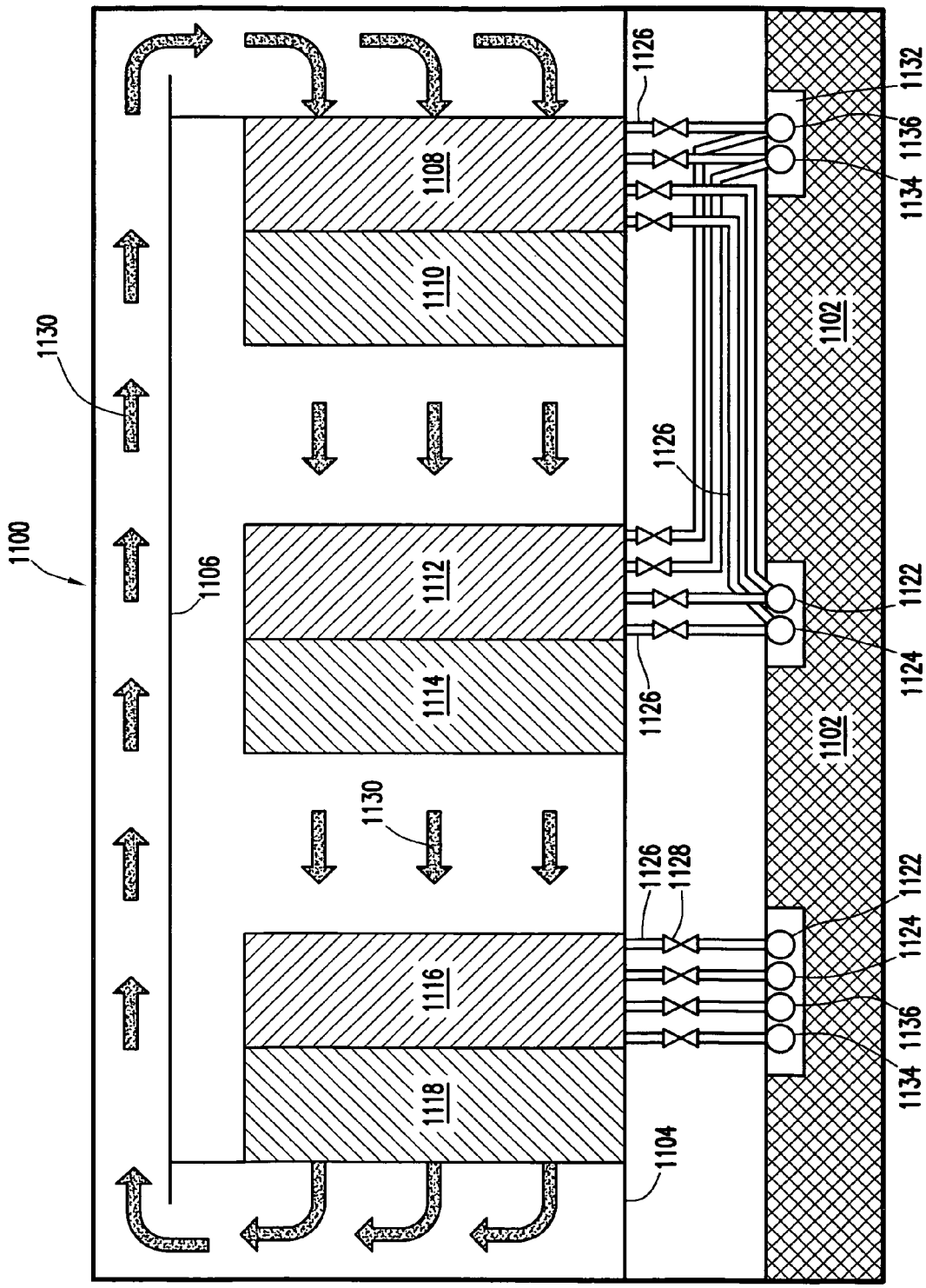
FIG. 16 is a side view of a data center including alternating rows of air-cooled racks and integral air conditioners mounted to the air-cooled racks according to the present invention.

FIG. 16 is a side view of a data center including air-cooled racks and air conditioners. The data center comprises room 1100, raised floor 1104, foundation 1102, and false ceiling 1106 for separation of the return airflow. Within room 1100 are first air conditioner 1108, first air-cooled rack 1110, second air conditioner 1112, second air-cooled rack 1114, third air conditioner 1116, and third rack 1118. First air conditioner 1108 is configured such that it is integral to first air-cooled rack 1110 and mounted on the air inlet side of first air-cooled rack 1110. Similarly, second air conditioner 1112 is mounted and integral to second air-cooled rack 1114, and third air conditioner 1116 is mounted and integral to third air-cooled rack 1118.

The conditioned air is blown through the air-cooled rack by its corresponding air conditioner. Air within room 1100 is drawn into first air conditioner 1108 as shown by arrows indicating airflow labeled 1130. First air conditioner 1108 conditions the air within room 1100 and blows the conditioned air through first air-cooled rack 1110. Second air conditioner 1112 similarly draws in air within room 100 and air exhausted from first air-cooled rack 1110, conditions the air and blows the conditioned air through second air-cooled rack 1114. Third air conditioner 1116 similarly blows conditioned air through third air-cooled rack 1118.

Still referring to FIG. 16, the plumbing required to deliver chilled fluid to the air conditioners in the present embodiment is found underneath raised floor 1104 within trenches 1132 of foundation 1102. A further feature of this embodiment provides for redundancy in the chilled fluid supply plumbing. A first building chilled fluid supply is provided through first chilled fluid supply pipes 1122, and returned to the main chiller (not shown) through first chilled fluid return pipes 1124. Also present are a second building chilled fluid supply provided through second chilled fluid supply pipes 1134 and returned to the main chiller through second chilled fluid return pipes 1136. Each air conditioner is connected through conditioner pipes 1126 to first chilled fluid supply pipe 1122 and first chilled fluid return pipe 1124, and to second chilled fluid supply pipe 1134 and second chilled fluid return pipe 1136. Each conditioner pipe 1126 includes a fluid coupling 1128. The redundant plumbing provides that in the event first chilled fluid supply pipe 1122 or first chilled fluid return pipe 1124 fails, the air conditioners can continue to receive chilled fluid from the second chilled fluid loop comprising second chilled fluid supply pipe 1134 and second chilled fluid return pipe 1136.

Figure 17:
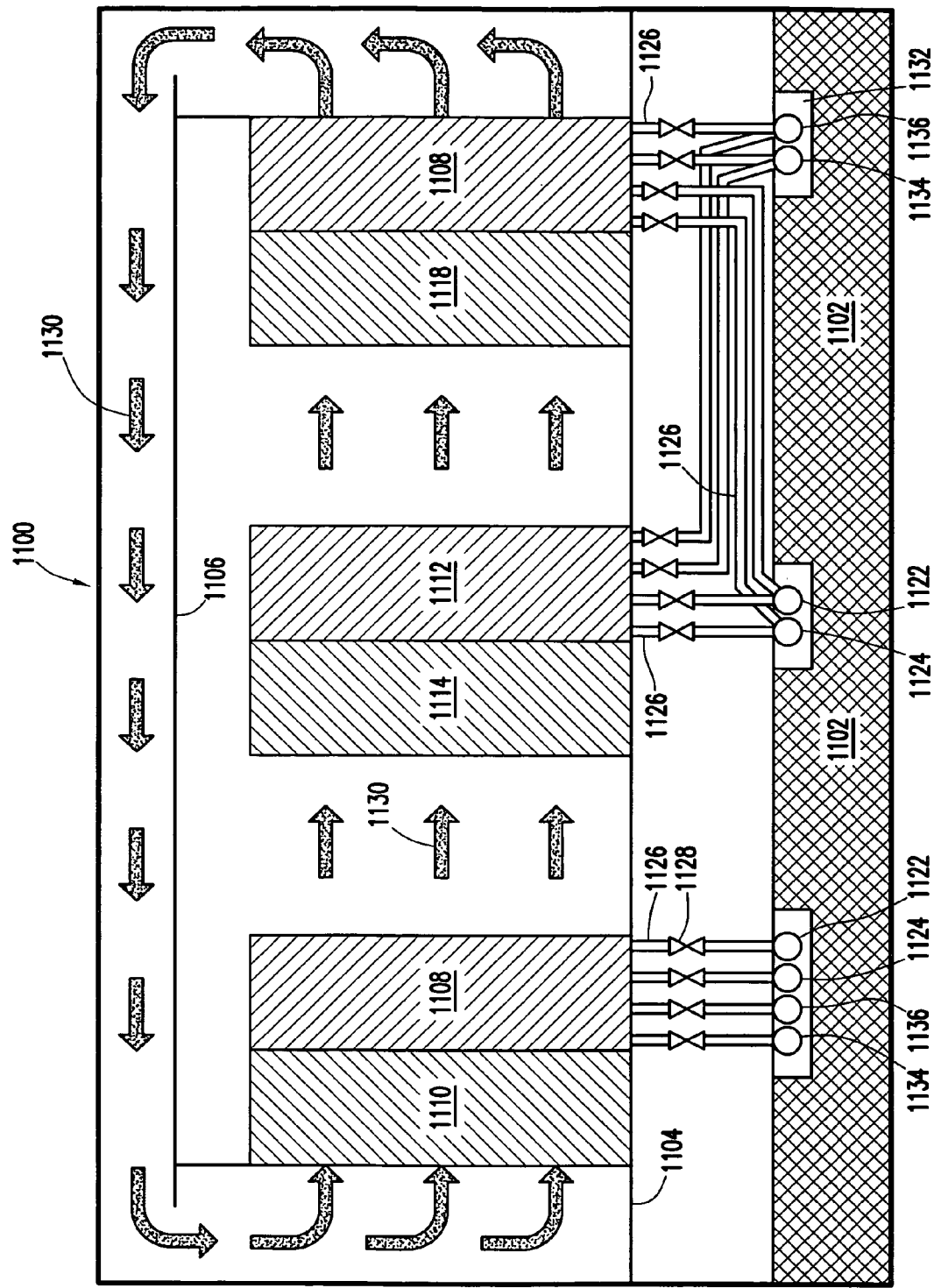
FIG. 17 is a side view of a data center including alternating rows of air-cooled racks and integral air conditioners mounted to the air-cooled racks according to the present invention.

FIG. 17 is a side view of a data center including air-cooled racks and air conditioners. The data center comprises room 1100, raised floor 1104, foundation 1102, and false ceiling 1106 for separation of the return airflow. Within room 1100 are first air conditioner 1108, first air-cooled rack 1110, a second air conditioner 1112, a second air-cooled rack 1114, a third air conditioner 1116, and a third air-cooled rack 1118. First air conditioner 1108 is configured such that it is integral to first air-cooled rack 1110 and mounted on the air exhaust side of first air-cooled rack 1110. Similarly, second air conditioner 1112 is mounted and integral to second air-cooled rack 1114, and third air conditioner 1116 is mounted and integral to third air-cooled rack 1118.

The conditioned air within room 1100 is drawn through an air-cooled server by its corresponding air conditioner. Air within room 1100 is drawn into first air-cooled server 1110 by first air conditioner 1108, as shown by arrows indicating airflow labeled 1130. First air conditioner 1108 conditions the air exiting first air-cooled rack 1110 and blows it into room 1100. Second air conditioner 1112 draws the conditioned air within room 1100 through second air cooled-rack 1114 as shown by airflow arrow 1130, conditions the air exiting second air-cooled rack 1114 and blows the conditioned air into room 1100. Similarly, third air conditioner 1116 draws conditioned air within room 100 through third air-cooled rack 1118, conditions the air exiting third air-cooled rack 1118 and blows the conditioned air into room 1100.

Still referring to FIG. 17, the plumbing required by the air conditioners for delivery of chilled fluid is found underneath raised floor 1104 within trenches 1132 in foundation 1102. A first building chilled fluid supply is provided through first chilled fluid supply pipes 1122, and returned to the main chiller through first chilled fluid return pipes 1124. Also present are a second building chilled fluid supply provided through second chilled fluid supply pipes 1134 and returned to the main chiller through second chilled fluid return pipes 1136. Each air conditioner is connected through conditioner pipes 1126 to first chilled fluid supply pipe 1122 and first chilled fluid return pipe 1124, and to second chilled fluid supply pipe 1134 and second chilled fluid return pipe 1136 through conditioner pipes 1126. Each conditioner pipe 1126 includes a fluid coupling 1128. The redundant plumbing in the present embodiment provides that in the event that the circuits comprising the first chilled fluid supply pipe 1122 or the first chilled fluid return pipe 1124 fails, the air conditioners can continue to receive chilled fluid from the second chilled fluid loop comprising second chilled fluid supply pipe 1134 and second chilled fluid return pipe 1136.

Figure 18:
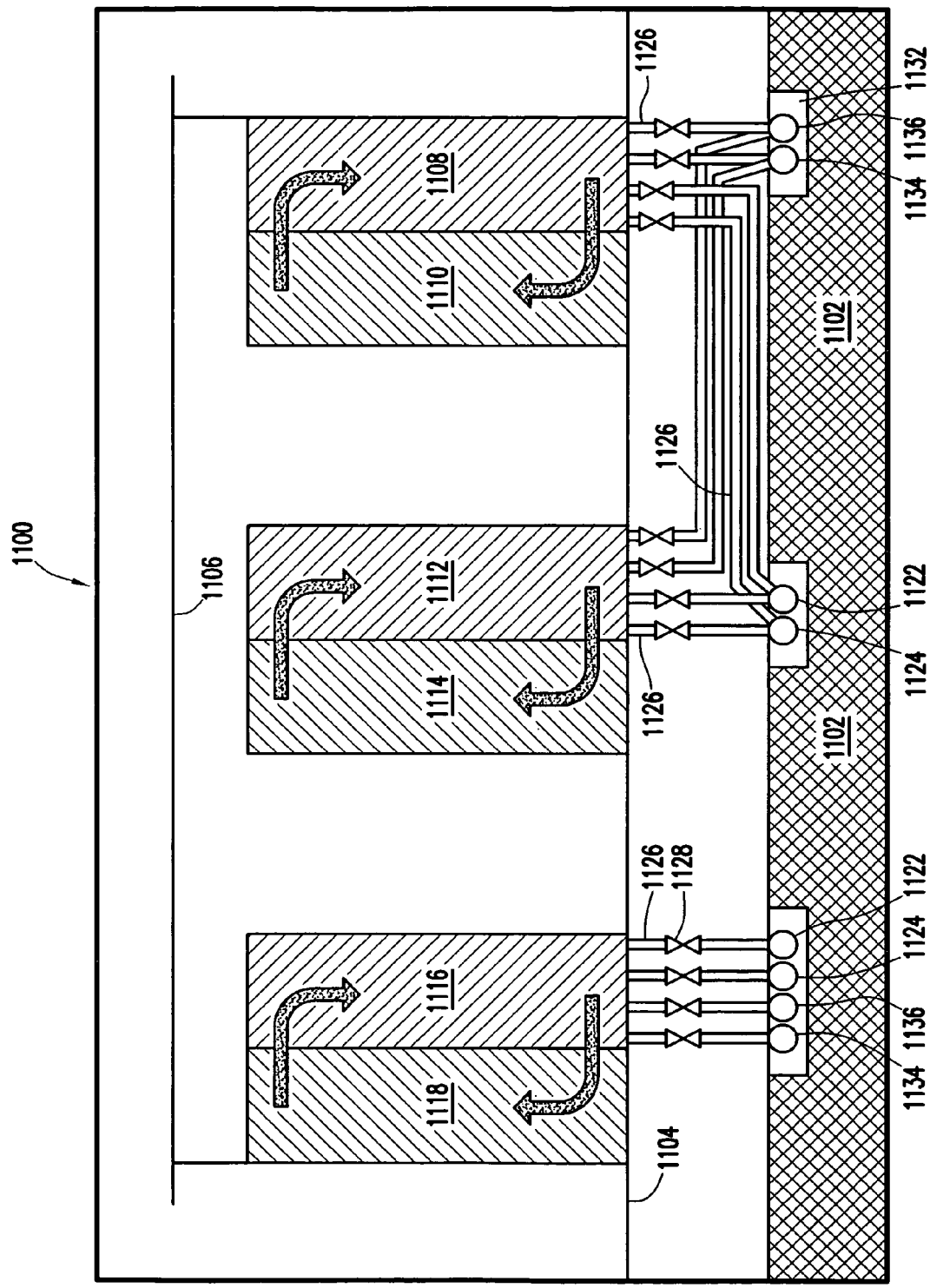
FIG. 18 is a side view of a data center including alternating rows of air-cooled racks and integral air conditioners mounted to the air-cooled racks according to the present invention.

FIG. 18 is a side view of a data center including air-cooled racks and air conditioners. The data center comprises room 1100, raised floor 1104, foundation 1102, and false ceiling 1106 for separation of the return airflow. Within room 1100 are first air conditioner 1108, first air-cooled rack 1110, second air conditioner 1112, second air-cooled rack 1114, third air conditioner 1116, and third air-cooled rack 1118. In certain embodiments, the racks and air conditioners may be combined in a single rack. First air conditioner 1108 is configured such that it is integral to first air-cooled rack 1110 and mounted on first air-cooled rack 1110. Similarly, second air conditioner 1112 is mounted and integral to second air-cooled rack 1114, and third air conditioner 1116 is mounted and integral to third air-cooled rack 1118.

The integral air-cooled rack and air conditioner combination are sealed from the environment of room 1100. First air conditioner 1108 circulates conditioned air through first air-cooled rack 1110, allowing for superior air control. Similarly, second air conditioner 1112 circulates conditioned air through second air-cooled rack 1114, and third air conditioner 1116 circulates conditioned air through third air-cooled rack 1118. Each air conditioner is coupled through conditioner pipes 1126 to first chilled fluid supply pipe 1122, first chilled fluid return pipe 1124, second chilled fluid supply pipe 1134, and second chilled fluid return pipe 1136 so as to provide redundant supplies of chilled liquid to the air conditioner. Each conditioner pipe 126 includes a fluid coupling 1128.

Figure 19:
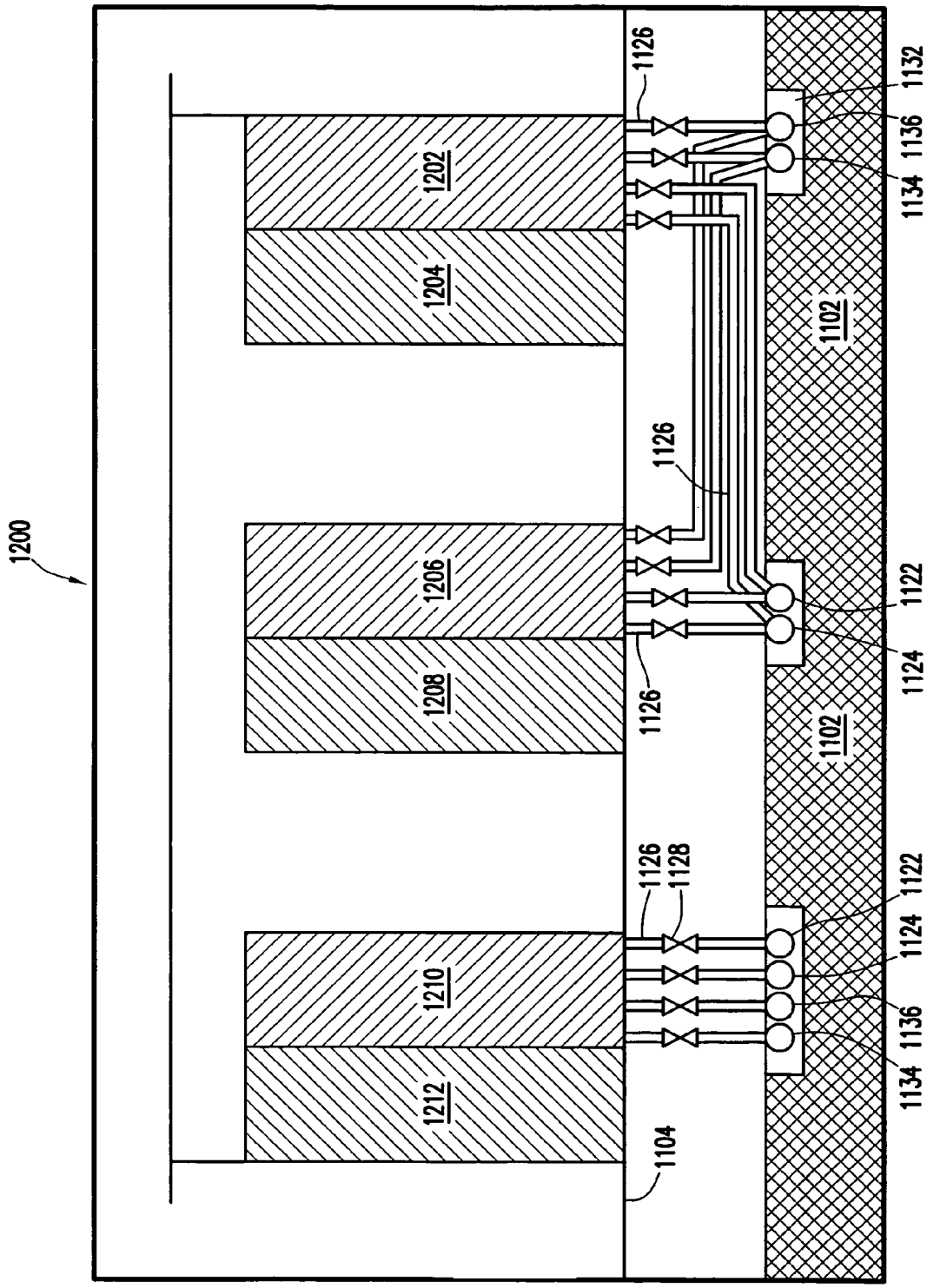
FIG. 19 is a side view of a data center including alternating rows of liquid-cooled racks and integral liquid conditioners mounted to the liquid-cooled racks according to the present invention.

FIG. 19 is a side view of a data center including liquid-cooled racks and liquid conditioners. The data center comprising room 1200, raised floor 1104, and foundation 1102. Within room 1200 are first liquid conditioner 1202, first liquid-cooled rack 1204, second liquid conditioner 1206, second liquid-cooled rack 1208, third liquid conditioner 1210, and third liquid-cooled rack 1212. In certain embodiments, the racks and liquid conditioners may be combined in a single rack. First liquid conditioner 1202 is configured such that it is integral to first rack 1204 and mounted on first liquid-cooled rack 1204. Similarly, second liquid conditioner 1206 is mounted and integral to second liquid-cooled rack 1208, and third air conditioner 1210 is mounted and integral to third liquid-cooled rack 1212.

The integral liquid-cooled rack and liquid conditioner are sealed from the environment of room 1200 and connected through internal conditioned liquid lines (not shown). First liquid conditioner 1202 circulates conditioned liquid through first liquid-cooled rack 1204. Similarly, second liquid conditioner 1206 circulates conditioned liquid through second liquid-cooled rack 1208, and third liquid conditioner circulates conditioned liquid through third liquid-cooled rack 1210. Each liquid conditioner is coupled through conditioner pipes 1126 to first chilled fluid supply pipe 1122, first chilled fluid return pipe 1124, second chilled fluid supply pipe 1134, and second chilled fluid return pipe 1136. Each conditioner pipe 1126 includes a fluid coupling 1128 can be in one rack The above discussion is meant to be illustrative of the principles and various embodiments of the present invention. Numerous variations and modifications will become apparent to those skilled in the art once the above disclosure is fully appreciated. For example, there are numerous chilled fluid pipe and conditioned liquid pipe configurations that may be implemented to create a redundancy in the cooling system plumbing. It is intended that the following claims be interpreted to embrace all such variations and modifications.

What is claimed is:

1. A data center comprising:
 a room;
 first and second chilled fluid supply pipes within said room;
 first and second chilled fluid return pipes within said room;
 a plurality of fluid couplings connected with said first and second chilled fluid supply pipes and said first and second chilled fluid return pipes, each of which is configured to connect to either an air conditioner or a liquid conditioner; a raised floor, wherein said first and second chilled fluid supply pipes are under said raised floor, and wherein said first and second chilled fluid return pipes are under said raised floor;
 a first air conditioner coupled to said first and second chilled fluid supply pipes through a pair of said fluid couplings, and coupled to said first and second chilled fluid supply pipes through another pair of said fluid couplings; and
 a first air-cooled server configured such that conditioned air exiting said first air conditioner enters air intakes of said first air-cooled server.

2. The data center of claim 1 further comprising:
 a second air conditioner coupled to said first and second chilled fluid supply pipes through a pair of said fluid couplings, and coupled to said first and second chilled fluid return pipes through another pair of said fluid couplings, and configured such that warm air exiting said first air-cooled server enters air intakes of said second air conditioner; and
 a second air-cooled server configured such that conditioned air exiting said second air conditioner enters air intakes of said second air-cooled server.

3. The data center of claim 2, wherein said first air conditioner is configured such that warm air exiting said second air-cooled server enters air intakes of said first air conditioner.

4. The data center of claim 2, further comprising a false ceiling above said first air-cooled server and said first air conditioner.

5. The data center of claim 4, wherein said false ceiling is configured to separate a flow of warm air to an intake of said first air conditioner from conditioned air flowing from said second air conditioner to said second air-cooled server.

6. The data center of claim 1, further comprising:
 a second air conditioner coupled to said second chilled fluid supply pipe through one of said fluid couplings, and coupled to said second chilled fluid return pipe through another of said fluid couplings; and
 at least one row of air-cooled servers comprising said first air-cooled server, said at least one row of air-cooled servers configured such that conditioned air exiting said first air conditioner or said second air conditioner enters air intakes of said at least one row of air-cooled servers.

7. A data center comprising:
 a room;
 first and second chilled fluid supply pipes within said room;
 first and second chilled fluid return pipes within said room;
 a plurality of fluid couplings connected with said first and second chilled fluid supply pipes and said first and second chilled fluid return pipes, each of which is configured to connect to either an air conditioner or a liquid conditioner; and
 a raised floor, wherein said first and second chilled fluid supply pipes are under said raised floor, and wherein said first and second chilled fluid return pipes are under said raised floor;
 a first liquid conditioner coupled to said first and second chilled fluid supply pipes through a pair of said fluid couplings, and coupled to said first and second chilled fluid return pipes through another pair of said fluid couplings;
 a first liquid-cooled server;
 a first conditioned liquid pipe configured to flow conditioned liquid from said first liquid conditioner to said first liquid-cooled server; and
 a first warm fluid pipe configured to flow warm liquid from said first liquid-cooled server to said first liquid conditioner.

8. The data center of claim 7, further comprising:
 a second conditioned liquid pipe configured to flow conditioned liquid from said first liquid conditioner to said first liquid-cooled server; and
 a second warm fluid pipe configured to flow warm liquid from said first liquid-cooled server to said first liquid conditioner.

9. The data center of claim 7, further comprising:
 a second liquid conditioner coupled to said second chilled fluid supply pipe through one of said fluid couplings, and coupled to said second chilled fluid return pipe through another of said fluid couplings;
 a second liquid-cooled server;
 said first conditioned liquid pipe further configured to flow conditioned liquid from said first liquid conditioner to said second liquid-cooled server;
 said first warm liquid pipe further configured to flow warm liquid from said second liquid-cooled server to said first liquid conditioner;

a second conditioned liquid pipe configured to flow conditioned liquid from said second liquid conditioner to said first liquid-cooled server and said second liquid-cooled server; and a second warm liquid pipe configured to flow warm liquid from said first liquid-cooled server and said second liquid-cooled server to said second liquid conditioner.

10. The data center of claim 7, further comprising:

a second liquid conditioner coupled to said second chilled fluid supply pipe through one of said fluid couplings, and coupled to said second chilled fluid return pipe through another of said fluid couplings;

a second conditioned liquid pipe configured to flow conditioned liquid from said second liquid conditioner to said first liquid-cooled server; and a second warm liquid pipe configured to flow warm liquid from said first liquid-cooled server to said second liquid conditioner.

11. The data center of claim 1, wherein said first air conditioner is mounted to said first air-cooled server on the inlet side of said first air-cooler server such that conditioned air from said first air conditioner is blown through said first air-cooled server.

12. The data center of claim 11, further comprising:

a second air-cooled server;

a second air conditioner coupled to said first and second chilled fluid supply pipes through a pair of said fluid couplings, and coupled to said first and second fluid return pipes through another pair of said fluid couplings, and configured such that warm air exiting said first air-cooled server enters air intakes of said second air conditioner; and said second air conditioner mounted to said second air-cooled server on the inlet side of said second air-cooler server such that conditioned air from said second air conditioner is blown through said second air-cooled server.

13. The data center of claim 1, further comprising:

a second air-cooled server;

said first air conditioner mounted to said first air-cooled server on the exhaust side of said first air-cooled server;

a second air conditioner coupled to said first and second chilled fluid supply pipes through a pair of said fluid couplings, and coupled to said first and second fluid return pipes through another pair of said fluid couplings, and mounted to said second air-cooled server on the exhaust side of said second air-cooled server; and said first air conditioner drawing conditioned air from said second air conditioner through said first air-cooled server, and said second air conditioner drawing conditioned air from said first air conditioner through said second air-cooled server.

14. The data center of claim 1, wherein said first air conditioner is mounted and integral to said first air-cooled server, and configured such that first air conditioner causes conditioned air to circulate throughout said first air-cooled server.

15. The data center of claim 7, wherein said first liquid conditioner is mounted and integral to said first liquid-cooled server, and configured such that first liquid conditioner causes conditioned liquid to circulate throughout said first liquid-cooled server.

16. A data center comprising:

a room comprising at least two fluid supply pipes and at least two fluid return pipes;

a plurality of servers disposed within said room; and a plurality of cooling systems coupled to the fluid supply pipes and the fluid return pipes;

wherein said plurality of cooling systems are operable to transfer heat from said plurality of servers to fluid from at least one of the fluid supply pipes, wherein heat generated by one of said plurality of servers is selectably transferable to the fluid from at least two of the fluid supply pipes.

17. The data center of claim 16 wherein each of said plurality of cooling systems is coupled to at least two of the fluid supply pipes and at least two of the fluid return pipes.

18. The data center of claim 16 wherein the heat generated by one of said plurality of servers is transferable to at least two of said plurality of cooling systems.

19. The data center of claim 16 wherein said plurality of servers are air-cooled servers and said plurality of cooling systems are operable to generate a cooled airflow.

20. The data center of claim 16 wherein said plurality of servers are liquid-cooled servers and said plurality of cooling systems are operable to generate a cooled liquid.

21. A method for configuring servers within a data center comprising the steps of:

providing a room;

providing a first and second chilled fluid supply pipe within said room;

providing a first and second chilled fluid return pipe within said room;

attaching a plurality of fluid couplings to said first and second chilled fluid supply pipes and said first and second chilled fluid return pipes, wherein each of said plurality of fluid couplings is configured to connect to either an air conditioner or a liquid conditioner;

providing a first and second air-cooled server;

providing a first and second air conditioner, connected to said first and second chilled fluid supply pipes and to said first and second fluid return pipes through said plurality of fluid couplings;

configuring said first air-cooled server such that conditioned air exiting said first air conditioner enters air intakes of said first air-cooled server;

configuring said second air conditioner such that warm air exiting said first air-cooled server enters air intakes of said second air conditioner; and configuring said second air-cooled server such that conditioned air exiting said second air conditioner enters air intakes of said second air-cooled server.

22. The method of claim 21, further comprising configuring the first air conditioner such that warm air exiting the second air-cooled server enters air intakes of the first air conditioner.

23. The method of claim 22, wherein the air conditioners are configured such that they can be replaced with a liquid conditioner without any changes in data center infrastructure.

* * * * *